United States Patent
May et al.

(10) Patent No.: US 10,790,233 B2
(45) Date of Patent: Sep. 29, 2020

(54) PACKAGE SUBSTRATES WITH INTEGRAL DEVICES

(71) Applicant: Intel Corporation, Santa Clara, CA (US)

(72) Inventors: Robert Alan May, Chandler, AZ (US); Kristof Kuwawi Darmawikarta, Chandler, AZ (US); Sri Ranga Sai Boyapati, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/097,597

(22) PCT Filed: May 25, 2016

(86) PCT No.: PCT/US2016/034016
§ 371 (c)(1),
(2) Date: Oct. 29, 2018

(87) PCT Pub. No.: WO2017/204789
PCT Pub. Date: Nov. 30, 2017

(65) Prior Publication Data
US 2019/0157210 A1  May 23, 2019

(51) Int. Cl.
*H01L 21/48* (2006.01)
*H01L 23/538* (2006.01)
(Continued)

(52) U.S. Cl.
CPC ...... *H01L 23/5389* (2013.01); *H01L 21/4846* (2013.01); *H01L 23/498* (2013.01);
(Continued)

(58) Field of Classification Search
CPC ............ H01L 23/5389; H01L 21/4846; H01L 23/9822; H01L 23/522; H01L 23/538;
(Continued)

(56) References Cited

U.S. PATENT DOCUMENTS 8,552,430 B2 * 10/2013 Park .................. H01L 27/3248
257/59
2010/0255619 A1  10/2010 Kwon et al.
(Continued)

FOREIGN PATENT DOCUMENTS

WO  2017204789 A1  11/2017

OTHER PUBLICATIONS

International Search Report and Written Opinion issued in PCT Application No. PCT/US2016/034016 dated Feb. 20, 2017; 11 pages.

*Primary Examiner* — Dinh T Le
(74) *Attorney, Agent, or Firm* — Patent Capital Group

(57) ABSTRACT

Disclosed herein are package substrates with integrated components, as well as related apparatuses and methods. For example, in some embodiments, an integrated circuit (IC) package, may include: a substrate having opposing first and second faces, an insulating material disposed between the first and second faces, and a thin film transistor (TFT) disposed between the first and second faces, wherein a conductive portion of the TFT is disposed on a layer of the insulating material, and the conductive portion of the TFT is a gate, source, or drain of the TFT; and a die coupled to the first face of the substrate.

23 Claims, 18 Drawing Sheets

(51) Int. Cl.

| | |
|---|---|
| *H01L 23/498* | (2006.01) |
| *H01L 23/522* | (2006.01) |
| *H01L 23/525* | (2006.01) |
| *H01L 27/12* | (2006.01) |
| *H01L 49/02* | (2006.01) |
| *H01L 29/786* | (2006.01) |

(52) U.S. Cl.
CPC .. *H01L 23/49822* (2013.01); *H01L 23/49838* (2013.01); *H01L 23/522* (2013.01); *H01L 23/525* (2013.01); *H01L 23/538* (2013.01); *H01L 27/1218* (2013.01); *H01L 28/60* (2013.01); *H01L 29/786* (2013.01); *H01L 23/5384* (2013.01); *H01L 2224/16225* (2013.01); *H01L 2924/15192* (2013.01); *H01L 2924/15311* (2013.01)

(58) Field of Classification Search
CPC ........... H01L 28/60; H01L 2224/16225; H01L 2924/15311
See application file for complete search history.

(56) References Cited

U.S. PATENT DOCUMENTS

| | | | |
|---|---|---|---|
| 2011/0234964 A1* | 9/2011 | Moriwaki | G02F 1/13452 349/149 |
| 2013/0280858 A1 | 10/2013 | Kimura | |
| 2014/0374740 A1 | 12/2014 | Lou et al. | |
| 2015/0250058 A1 | 9/2015 | Ramachandran et al. | |
| 2015/0303308 A1 | 10/2015 | Wei et al. | |
| 2018/0197897 A1* | 7/2018 | Xin | H01L 21/28 |

* cited by examiner

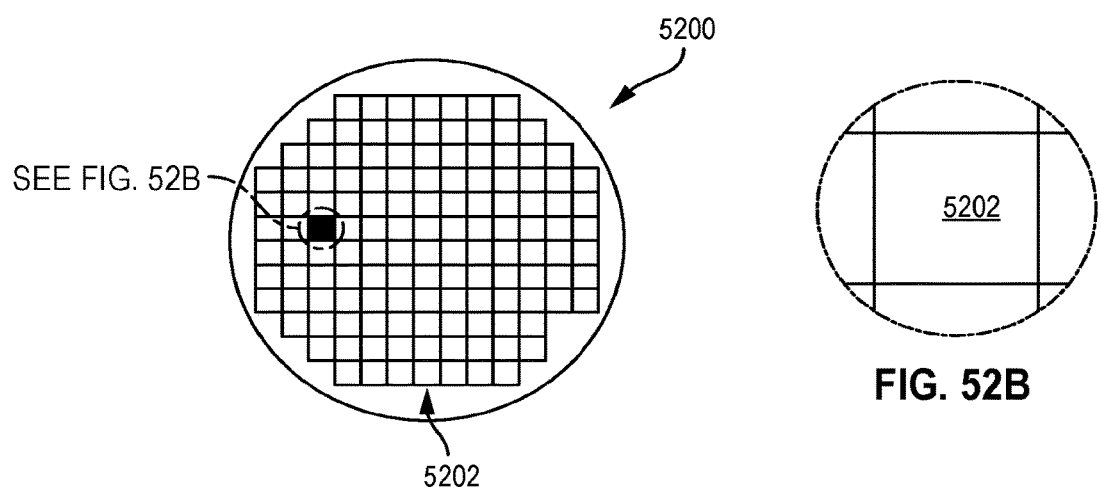
FIG. 52A
FIG. 52B
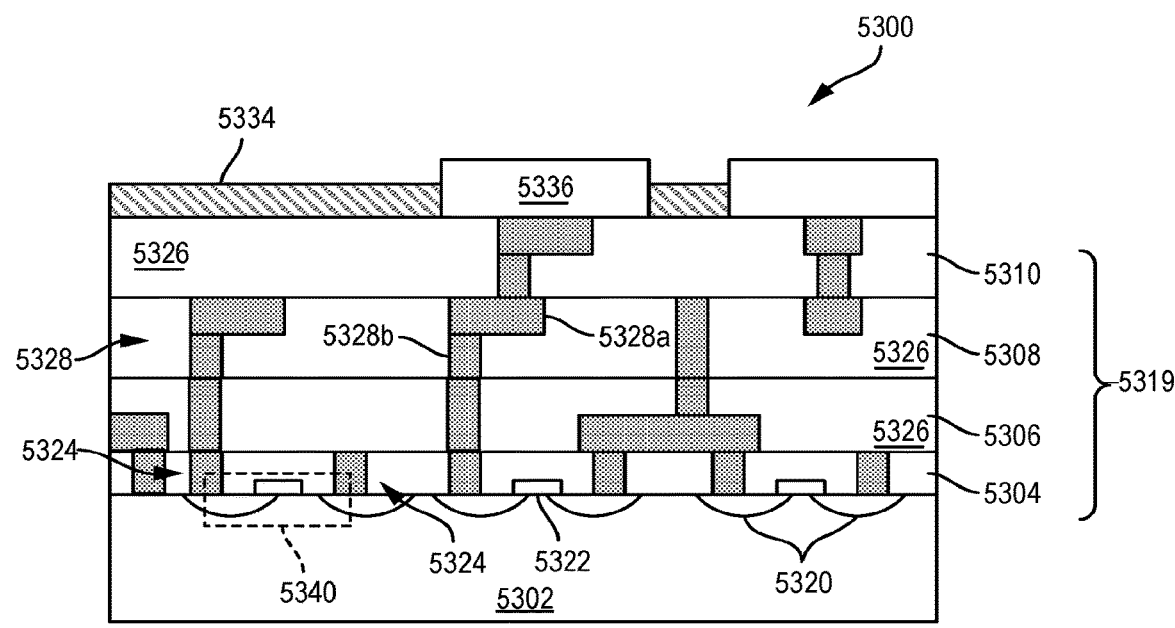
FIG. 53

PACKAGE SUBSTRATES WITH INTEGRAL DEVICES

BACKGROUND

Package substrates are traditionally used to route electrical connections between a die and a circuit board. Passive devices, such as capacitors, may be disposed on a face of the package substrate along with the die.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 52A and 52B are top views of a wafer and dies that may be used in an IC package with any of the package substrates disclosed herein.

FIG. 53 is a cross-sectional side view of an IC device that may be included in a die of an IC package having any of the package substrates disclosed herein.

DETAILED DESCRIPTION

Figure 1:
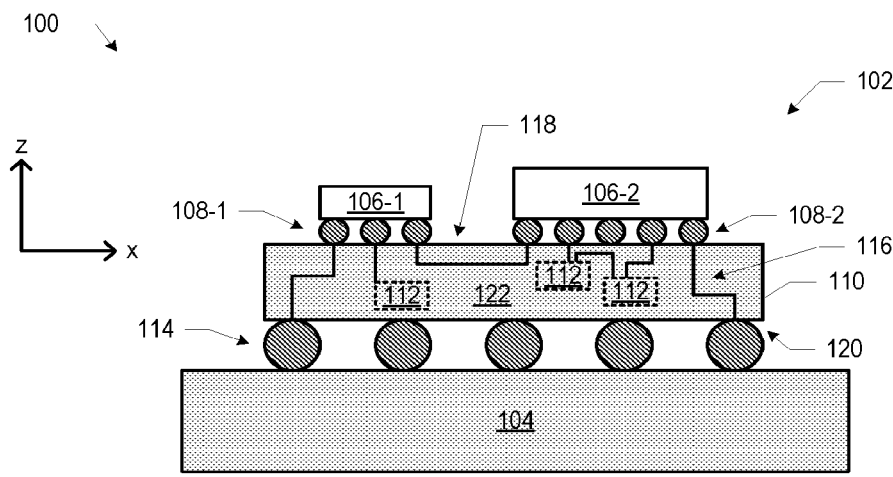
FIG. 1 is a cross-sectional side view of an integrated circuit (IC) assembly including an IC package having a package substrate that includes one or more integral devices, in accordance with various embodiments.

Disclosed herein are package substrates with integrated components, as well as related apparatuses and methods. For example, in some embodiments, an integrated circuit (IC) package, may include: a substrate having opposing first and second faces, an insulating material disposed between the first and second faces, and a thin film transistor (TFT) disposed between the first and second faces, wherein a conductive portion of the TFT is disposed on a layer of the insulating material, and the conductive portion of the TFT is a gate, source, or drain of the TFT; and a die coupled to the first face of the substrate.

Traditionally, package substrates have been regarded as space transformers, and have been structured to manage the physical routing of connections between a die and a circuit board (e.g., to route power and signals between the die and the circuit board). Previously, to increase the functionality of a package substrate, prefabricated dies, sensors, or capacitors would have had to be embedded in the package substrate. Each of these components would have been purchased separately, and then separately assembled into the package substrate, with each such component adding significant cost and process complexity.

Various ones of the embodiments disclosed herein provide transistor and capacitor structures fabricated directly into a package substrate. Such structures may be used to provide substrate-integrated logic or other substrate-integrated circuitry that may perform supporting functions for other components coupled to the package substrate. Examples of such supporting functions may include chipset functions (e.g., die power management) or sensor functions. Such structures may also be used to perform functions that are independent of a die coupled to the package substrate, and may therefore act as independent computing devices.

Additionally, various ones of the embodiments disclosed herein apply existing package substrate processes to fabricate transistor arrays with channel lengths on the order of single microns. Capacitors may be formed using these processes as well (e.g., on the same layer as the transistors), mitigating the performance losses that occur when capacitors are spaced far apart from the transistors with which they are in communication. The processes disclosed herein may be used to integrate a variety of functionalities directly into a package substrate, eliminating or reducing the need to separately acquire prepackaged components and reducing assembly costs.

Relative to the higher cost of embedding dies or other separate devices in a package substrate, or fabricating transistors and capacitors directly in silicon, various ones of the embodiments disclosed herein may enable transistors and capacitors to be formed inexpensively in a package substrate. Such embodiments may be particularly advantageous in ultra-low-cost computing applications, system-in-package applications, and server applications (in which capacitors may be used in voltage regulators to meet a high demand for power delivery). Moreover, the techniques used to fabricate transistors in a package substrate may also be extended to fabricate capacitors in the package substrate at little to no additional process cost. The embodiments disclosed herein may achieve tight integration of logic in a package substrate by putting transistors and capacitors in otherwise available real estate in the package substrate, increasing functionality without increasing the z-height of the packages (and potentially reducing the z-height of packages by removing conventional "external" capacitors). This improvement in computing density may enable new form factors for wearable computing devices and system-in-package applications in which z-height is constrained.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, a "high-k dielectric material" may refer to a material having a higher dielectric constant than silicon oxide.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

FIG. 1 is a cross-sectional side view of an integrated circuit (IC) assembly 100 including an IC package 102 having a package substrate 110 and multiple dies 106 disposed thereon. In particular, the dies 106 may be coupled to a first face 118 of the package substrate 110 via first level interconnects 108, as illustrated. In some embodiments, the first level interconnects 108 may include solder bumps or balls (as illustrated in FIG. 1); in other embodiments, the first level interconnects 108 may include wirebonds or any other suitable interconnect. Although two dies, 106-1 and 106-2, are illustrated in FIG. 1, this is simply an example, and the IC package 102 may include one or more dies 106. The dies 106 may perform any suitable functionality, and may include processing devices, memory, communications devices, sensors, or any other computing components or circuitry. In some embodiments, an underfill material (not shown) may be disposed between the dies 106 and the first face 118 of the package substrate 110. In some embodiments, an overmold material (not shown) may be disposed around the dies 106 and in contact with the first face 118 of the package substrate 110.

The package substrate 110 may be coupled to a circuit board 104 via the second level interconnects 114 disposed at the second face 120 of the package substrate 110. In some embodiments, the second level interconnects 114 may include solder balls (as illustrated in FIG. 1) for a ball grid array (BGA) coupling; in other embodiments, the second level interconnects 114 may include solder paste contacts to provide land grid array (LGA) interconnects, or any other suitable interconnect. The circuit board 104 may include conductive pathways (not shown) that allow power, ground, and other electrical signals to move between the circuit board 104 and the IC package 102, as known in the art. Although FIG. 1 illustrates a single IC package 102 disposed on the circuit board 104, this is simply for ease of illustration and multiple IC packages may be disposed on the circuit board 104 (e.g., as discussed below with reference to the circuit board 5402 of the assembly 5400 of FIG. 54). In some embodiments, the circuit board 104 may be a printed circuit board (PCB) (e.g., a motherboard). In some embodiments, the circuit board 104 may be another IC package, and the IC assembly 100 may be a package-on-package structure. In some embodiments, the circuit board 104 may be an interposer, and the IC assembly 100 may be a package-on-interposer structure.

The package substrate 110 may include an insulating material 122 and one or more integral devices 112, in accordance with various embodiments. An integral device 112 may be disposed in the insulating material 122, such that the integral device 112 is sandwiched between multiple layers of the insulating material 122. An integral device 112 may include one or more transistors (not illustrated in FIG. 1, but discussed in detail below with reference to thin film transistors 124) and/or one or more capacitors (also not illustrated in FIG. 1, but discussed in detail below with reference to capacitors 146). The package substrate 110 may include multiple integral devices 112 disposed at different distances from the first face 118 of the package substrate 110 (i.e., in the z-direction) and at different lateral locations in the package substrate 110 (e.g., in the x-direction). For example, the package substrate 110 may include integral devices 112 between multiple sets of layers of the insulating material 122 in the package substrate 110 and/or multiple integral devices 112 on a single layer of the insulating material 122. Although the term "insulating material 122" is used herein, different layers of the insulating material 122 in a package substrate 110 may be formed of different materials. For example, a "base" layer of insulating material 122 may be provided by a glass fiber reinforced core, a rigid carrier, or a peelable core panel, for example, while additional layers of insulating material 122 may be provided by an epoxy-based laminate.

The package substrate 110 may also include conductive pathways 116 through the insulating material 122. The conductive pathways 116 may couple the dies 106 to the circuit board 104 (e.g., via the first level interconnects 108 and the second level interconnects 114). The conductive pathways 116 may couple multiple ones of the dies 106 to each other (e.g., via the first level interconnects 108 and, in some embodiments, via one or more integral devices 112). The conductive pathways 116 may couple one or more integral devices 112 to one or more of the dies 106 (e.g., via the first level interconnects 108). The conductive pathways 116 may couple one or more integral devices 112 to the circuit board 104 (e.g., via the second level interconnects 114). Any suitable arrangement of conductive pathways 116 may couple the dies 106, the integral devices 112, and the circuit board 104, as desired.

The package substrate 110 may be an organic substrate. For example, in some embodiments, the insulating material 122 may be an organic material, such as an epoxy-based laminate. The insulating material 122 may be, for example, a build-up film (e.g., Ajinomoto build-up film). The insulating material 122 may include, for example, an epoxy with a phenolic hardener.

As noted above, an integral device 112 may include one or more transistors and/or capacitors. A number of embodiments of transistors and capacitors that may be included in the package substrate 110 as integral devices 112 are disclosed herein, and any of these embodiments may be included in any suitable combination in a package substrate 110.

Figure 2:
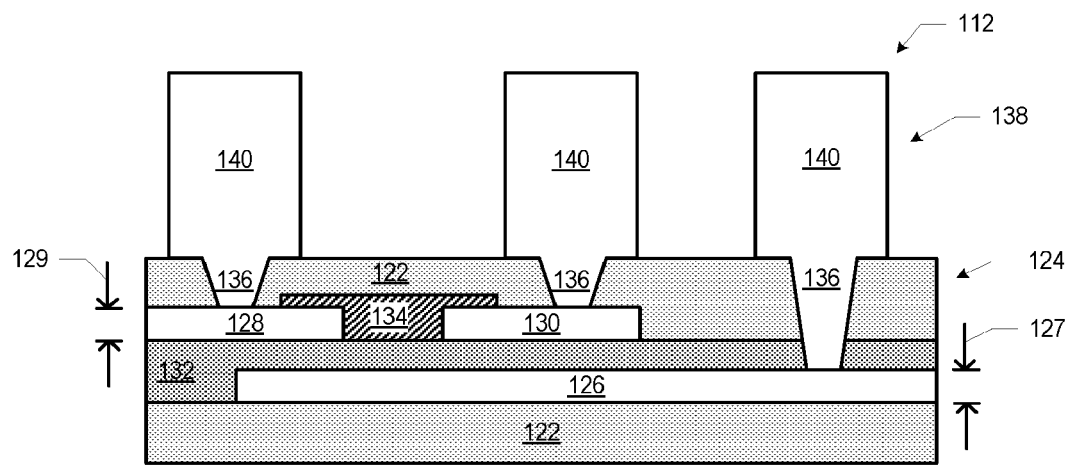
FIG. 2 is a cross-sectional side view of a portion of a package substrate including a thin film transistor (TFT) as an integral device, in accordance with various embodiments.

FIGS. 2-6 illustrate a number of different structures that may be included as integral devices 112 in a package substrate 110. For example, FIG. 2 is a cross-sectional side view of a portion of a package substrate 110 including a thin film transistor (TFT) 124 as an integral device 112, in accordance with various embodiments. The TFT 124 may include a gate 126 formed of a conductive material (e.g., a metal, such as copper) disposed on a layer of the insulating material 122. A high-k dielectric material 132 may be disposed on the gate 126, and a source 128 and a drain 130 may be disposed on the high-k dielectric material 132. The source 128 and the drain 130 may be formed of a conductive material (e.g., a metal, such as copper), and although one region of this conductive material is identified as the source 128 and another region is identified as the drain 130 in the accompanying figures, the source 128 and the drain 130 may be structurally interchangeable.

A semiconductor material 134 may be disposed on the high-k dielectric material 132 and between the source 128 and the drain 130, such that at least a portion of the high-k dielectric material 132 is disposed between the semiconductor material 134 and the gate 126. In some embodiments, the semiconductor material 134 may be compatible with a dry patterning process. For example, the semiconductor material 134 may include amorphous silicon, or an organic semiconductor. Amorphous silicon may be particularly advantageous for "higher" performance applications, while an organic semiconductor may be particularly advantageous for particularly cost-sensitive applications.

Another layer of insulating material 122 may be disposed on the source 128, the semiconductor material 134, and the drain 130, and separate conductive contacts 138 may extend through this insulating material 122 to separately contact the source 128, the drain 130, and the gate 126. The conductive contacts 138 may be formed of a conductive material (e.g., a metal, such as copper) and may include conductive vias 136 and/or conductive lines 140. The conductive lines 140 may be arranged to route electrical signals in a direction of a plane that is substantially parallel to the first face 118 and the second face 120 of the package substrate 110. For example, the conductive lines 140 may route electrical signals in a direction in and out of the page, and left and right in the page, from the perspective of FIG. 2. The conductive vias 136 may be arranged to route electrical signals in a direction of a plane that is substantially perpendicular to the first face 118 and the second face 120 of the package substrate 110 (e.g., up and down in the page, from the perspective of FIG. 2). In some embodiments, the conductive vias 136 may electrically couple conductive lines 140 disposed in different layers of the insulating material 122, as known in the art. Although a single additional layer of insulating material 122 is illustrated in FIG. 2 (and a number of the other drawings, this is simply for illustrative purposes, and multiple additional layers of insulating material 122, conductive vias 136, and/or conductive lines 140 may be used to form any desired electrical routing pathways. During use of the TFT 124 of FIG. 2 (and the other TFTs disclosed herein), voltages may be provided to the source 128, drain 130, and gate 126 (via the conductive contacts 138) to control the current flow through the semiconductor material 134 between the source 128 and the drain 130, as known in the art.

In some embodiments of the TFT 124 illustrated in FIG. 2, the thickness 127 of the gate 126 and the thickness 129 of the source 128/drain 130 may be between 1 and 10 microns (e.g., between 1 and 5 microns or between 1 and 2 microns). Such thicknesses may enable fine patterning of the conductive material that will be patterned to form the gate 126, source 128, and drain 130 (e.g., as discussed below with reference to FIGS. 35-42). In some embodiments, the thickness 127 of the gate 126 may be the same as the thickness 129 of the source 128/drain 130.

In some embodiments, the high-k dielectric material 132 may be laminated on top of the gate 126; in such embodiments, the thickness 127 of the gate 126 may be selected to be thin enough to enable adequate lamination of the high-k dielectric material 132, and this selection may be based on the thickness of the high-k dielectric material 132. In some embodiments, the thickness of the high-k dielectric material 132 (before lamination) may be between 1 and 5 microns; in some such embodiments, the thickness of the gate 126 may also be between 1 and 5 microns.

In any suitable ones of the embodiments disclosed herein, an adhesion promoter (not shown) may be disposed between the high-k dielectric material 132 and any conductive material disposed thereon ("above" or "below") to promote adhesion between the high-k dielectric material 132 and the conductive material. For example, in the TFT 124 of FIG. 2, an adhesion promoter may be disposed on the high-k dielectric material 132 to promote adhesion between the high-k dielectric material 132 and the source 128/drain 130. This adhesion promoter may be any suitable material, depending upon the high-k dielectric material 132. For example, the adhesion promoter may include titanium to facilitate adhesion between the high-k dielectric material 132 and the "incoming" material of the source 128/drain 130 (e.g., copper). In some embodiments, an adhesion promoter, such as silicon nitride or silicon oxide, may be disposed on the gate 126 to facilitate adhesion between the gate 126 and the "incoming" high-k dielectric material. Examples of the deposition of an adhesion promoter are discussed in further detail below.

Figure 3:
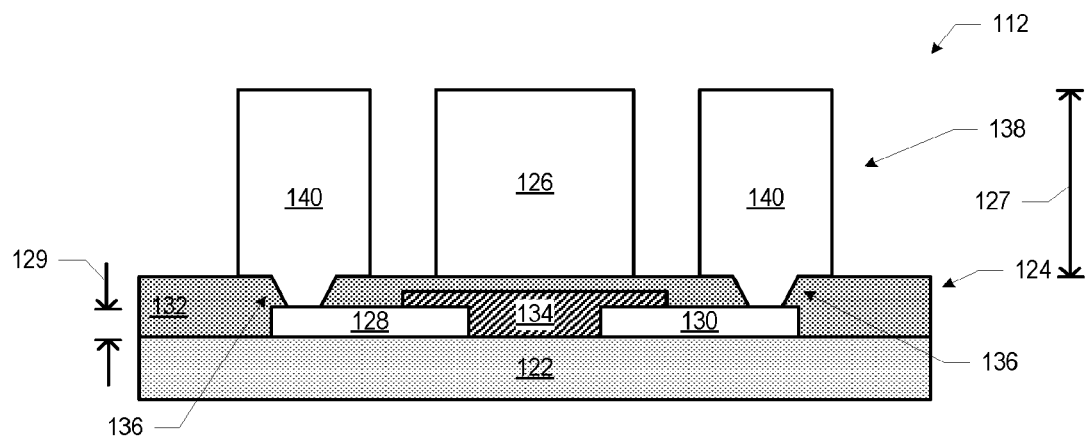
FIG. 3 is a cross-sectional side view of a portion of a package substrate including another TFT as an integral device, in accordance with various embodiments.

FIG. 3 is a cross-sectional side view of a portion of a package substrate 110 including another TFT 124 as an integral device 112, in accordance with various embodiments. The TFT 124 may include a source 128 and a drain 130 disposed on a layer of the insulating material 122. A semiconductor material 134 may be disposed on the layer of the insulating material 122, between the source 128 and the drain 130. A high-k dielectric material 132 may be disposed on the semiconductor material 134, and a gate 126 may be disposed on the high-k dielectric material 132 such that at least a portion of the high-k dielectric material 132 is disposed between the semiconductor material 134 and the gate 126. The source 128, the drain 130, the gate 126, the high-k dielectric material 132, and the semiconductor material 134 may take any suitable ones of the forms discussed above with reference to FIG. 2.

Another layer of insulating material 122 may be disposed on the high-k dielectric material 132, and separate conductive contacts 138 may extend through this insulating material 122 to separately contact the source 128 and the drain 130. The gate 126 may be formed at the same time as the conductive contacts 138, and the gate 126 may itself be contacted by one or more conductive vias or lines (not shown). The conductive contacts 138 may take any suitable ones of the forms discussed above with reference to FIG. 2. For example, the conductive contacts 138 may include conductive vias 136 and/or conductive lines 140.

In some embodiments of the TFT 124 illustrated in FIG. 3, the thickness 129 of the source 128/drain 130 may be between 1 and 10 microns (e.g., between 1 and 5 microns or between 1 and 2 microns). In some embodiments, the thickness 127 of the gate 126 may be greater than the thickness 129 of the source 128/drain 130. For example, the thickness 127 of the gate 126 may be the same as the thickness of the conductive lines 140 (and indeed, the gate 126 may be patterned at the same time as the conductive lines 140). For example, the thickness 127 may be between 10 and 20 microns (e.g., 15 microns) in some embodiments.

Figure 4:
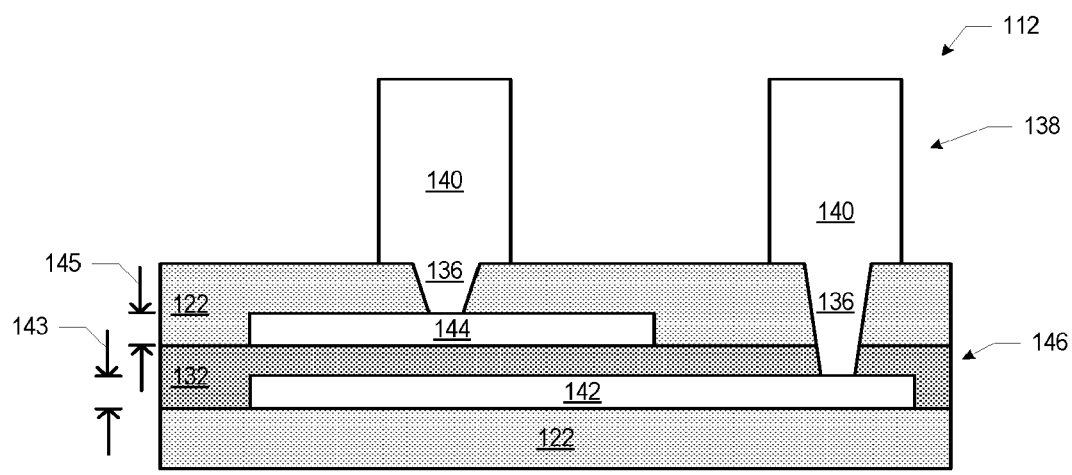
FIG. 4 is a cross-sectional side view of a portion of a package substrate including a capacitor as an integral device, in accordance with various embodiments.

FIG. 4 is a cross-sectional side view of a portion of a package substrate 110 including a capacitor 146 as an integral device 112, in accordance with various embodiments. The capacitor 146 may include a first plate 142 formed of a conductive material (e.g., a metal, such as copper) disposed on a layer of the insulating material 122. A high-k dielectric material 132 may be disposed on the first plate 142, and a second plate 144 may be disposed on the high-k dielectric material 132 such that at least some of the high-k dielectric material 132 is disposed between the first plate 142 and the second plate 144. The second plate 144 may also be formed of a conductive material (e.g., a metal, such as copper). Another layer of insulating material 122 may be disposed on the second plate 144, and separate conductive contacts 138 may extend through this insulating material 122 to separately contact the first plate 142 and the second plate 144.

The high-k dielectric material 132 and the conductive contacts 138 of FIG. 4 may take any suitable ones of the forms discussed above with reference to FIG. 2. For example, the conductive contacts 138 may include conductive vias 136 and/or conductive lines 140. In some embodiments of the capacitor 146 illustrated in FIG. 4, the thickness 143 of the first plate 142 may be the same as the thickness 145 of the second plate 144. For example, in some embodiments, the thicknesses 143 and 145 may be between 1 and 5 microns. In other embodiments of the capacitor 146 illustrated in FIG. 4, the thickness 143 may be different from the thickness 145.

Figure 5:
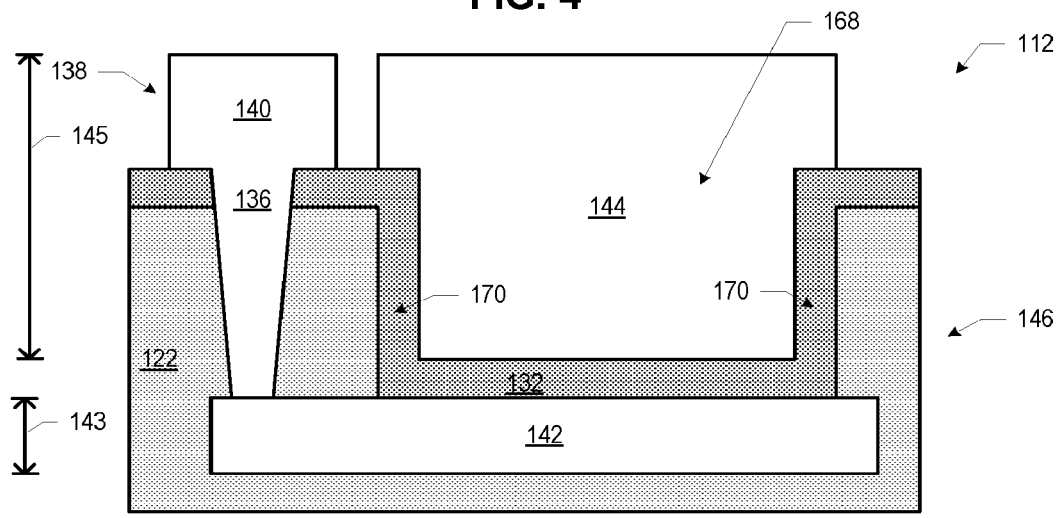
FIG. 5 is a cross-sectional side view of a portion of a package substrate including another capacitor as an integral device, in accordance with various embodiments.

FIG. 5 is a cross-sectional side view of a portion of a package substrate 110 including another capacitor 146 as an integral device 112, in accordance with various embodiments. The capacitor 146 may include a first plate 142 formed of a conductive material disposed on a layer of the insulating material 122. Additional insulating material 122 may be disposed on and/or around the plate 142 to form a cavity 168 along which the high-k dielectric material 132 may be disposed. For example, as shown in FIG. 5, the first plate 142 may provide the bottom of the cavity 168, the insulating material 122 may provide the sidewalls 170 of the cavity 168, and the high-k dielectric material 132 may be disposed on the sidewalls 170 and on the portion of the first plate 142 that provides a bottom of the cavity 168. The second plate 144 may be disposed on the high-k dielectric material 132 at least partially in the cavity 168 such that at least some of the high-k dielectric material 132 is disposed between the first plate 142 and the second plate 144. A conductive contact 138 may extend through the insulating material 122 (and may extend through the high-k dielectric material 132, as shown) to contact the first plate 142. The second plate 144 may be formed at the same time as the conductive contact 138, and the second plate 144 may itself be contacted by one or more conductive vias or lines (not shown).

The high-k dielectric material 132 and the conductive contact 138 of FIG. 5 may take any suitable ones of the forms discussed above with reference to FIG. 2. For example, the conductive contact 138 may include conductive vias 136 and/or conductive lines 140. In some embodiments, the thickness 143 of the first plate 144 of the capacitor 146 of FIG. 5 may be less than the thickness 145 of the second plate 144. For example, the thickness 143 may be between 1 and 20 microns, while the thickness 145 may be between 20 and 50 microns. In the embodiment illustrated in FIG. 6, the thickness 145 may be equal to a sum of the z-heights of the conductive via 136 and the conductive line 140. In some embodiments, the conductive lines 140 disclosed herein may have a height between 10 and 20 microns (e.g., 15 microns). In some embodiments, the conductive via 136 that extends between the conductive line 140 and the first plate 142 of the embodiment of FIG. 6 may have a height between 15 and 25 microns.

Figure 6:
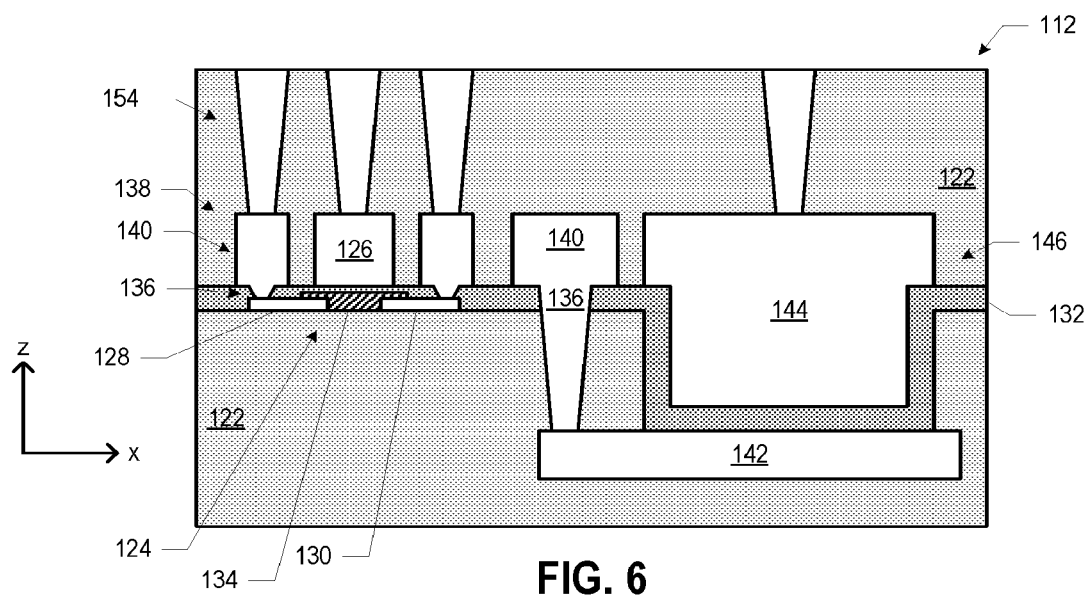
FIG. 6 is a cross-sectional side view of a portion of a package substrate including a TFT and a capacitor that are formed jointly, in accordance with various embodiments.

The capacitor 146 illustrated in FIG. 5 may be particularly efficient to integrate into conventional package substrate manufacturing processes. In such processes, the conductive lines 140 may have a standard thickness (e.g., 15 microns) selected to handle a specified power delivery. The first plate 142 of the capacitor 146 of FIG. 5 may have this thickness, and thus may be patterned along with other conductive lines 140 (not shown) in the same layer in the package substrate 110. Similarly, most conductive vias 136 between adjacent layers of conductive lines 140 may have a standard height (e.g., between 25 and 35 microns). The depth of the cavity 168 may be selected to match this height so that the second plate 144 may fill the cavity and be capped by a portion of conductive material equal to the thickness of the conductive lines 140 (as shown in FIG. 6), while the conductive via 136 extends down and contacts the first plate 142. The result is that the capacitor 146 uses conventional patterning techniques and dimensions for conductive lines 140 and conductive vias 136, and is thus particularly adapted to integration into conventional techniques for manufacturing the package substrate 110.

The x-y areas of the first plate 142 and the second plate 144 of the capacitors 146 disclosed herein may take any suitable values. For example, in some embodiments, the areas of the first plate 142 and the second plate 144 may each be between 0.0625 square millimeters (e.g., 250 microns by 250 microns) and 1 square millimeter.

As noted above, a package substrate 110 may include one or more TFTs 124 and one or more capacitors 146. In some embodiments, a TFT 124 and a capacitor 146 may be formed jointly in the sense that a single processing operation may be used to form a component of the TFT 124 and a component of the capacitor 146. For example, FIG. 6 illustrates an integral device 112 that includes the TFT 124 of FIG. 3 and the capacitor 146 of FIG. 5. As illustrated in FIG. 6, a single layer of the high-k dielectric material 132 may be used in both the TFT 124 and the capacitor 146. Other processing operations used to manufacture the TFT 124 and the capacitor 146 of FIG. 6 may jointly provide components of both the TFT 124 and the capacitor 146, as discussed below with reference to FIGS. 7-34.

Although the IC assembly 100 of FIG. 1 illustrates multiple dies 106 disposed on the package substrate 110, in some embodiments, no dies 106 may be included and, instead, the package substrate 110 (with the integral devices 112) may act as a standalone computing device. Such a device may be particularly advantageous in computing applications with very tight cost constraints (and lower performance requirements than those typically set for silicon-based transistor devices).

Any suitable techniques may be used to manufacture any of the package substrates 110 and integral devices 112 disclosed herein. FIGS. 7-49 illustrate various stages in the manufacture of various ones of the integral devices 112 disclosed herein. Although these figures illustrate particular manufacturing operations with reference to particular integral devices 112, the manufacturing operations discussed may be applied to form any other suitable embodiments of the integral devices 112. Additionally, although particular manufacturing techniques may be discussed or illustrated, alternative manufacturing techniques may also be used. For example, various operations discussed below may be part of semi-additive fabrication processes; in other embodiments, additive or subtractive processes may be used instead.

FIGS. 7-34 are cross-sectional side views of various stages in the manufacture of the TFT 124/capacitor 146 structure of FIG. 6, in accordance with various embodiments. Although the manufacturing operations of FIGS. 7-34 illustrate one embodiment of the joint formation of a TFT 124 and a capacitor 146, the operations of FIGS. 7-34 may be performed so as to form only a TFT 124 (by omitting the operations that relate to the formation of the capacitor 146) or as to form only a capacitor 146 (by omitting the operations that relate to the formation of the TFT 124). Dimensions, shapes, material characteristics, and other features of the structures discussed below with reference to FIGS. 7-34 may take the form of any of the embodiments of those structures disclosed herein.

Figure 7:
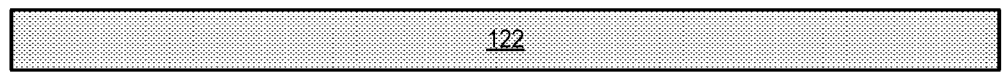
FIGS. 7-34 are cross-sectional side views of various stages in the manufacture of the TFT/capacitor structure of FIG. 6, in accordance with various embodiments.

FIG. 7 illustrates an assembly 202 including a layer of insulating material 122. The layer of insulating material 122 may be an organic material (e.g., an epoxy-based laminate), as discussed above. In some embodiments, the layer of insulating material 122 of FIG. 7 may be disposed on a glass fiber reinforced core, a rigid carrier, a stack of conventionally patterned layers of the package substrate 110, or a peelable core panel (e.g., an epoxy impregnated glass, stainless steel or another metal, etc.), for example. In some embodiments, the layer of insulating material 122 of FIG. 7 may be itself provided by a glass fiber reinforced core, a rigid carrier, or a peelable core panel, for example.

Figure 8:
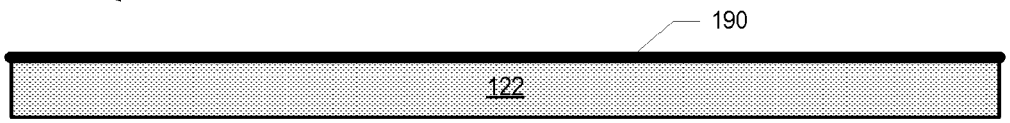

FIG. 8 illustrates an assembly 204 subsequent to providing a seed layer 190 of a conductive material on the insulating material 122 of the assembly 202 (FIG. 7). The seed layer 190 may be a thin layer of the conductive material that will be used to form the first plate 142 of the capacitor 146 of FIG. 6 (e.g., copper). In some embodiments, the seed layer 190 may be plated onto the insulating material 122 using an electroless process.

Figure 9:
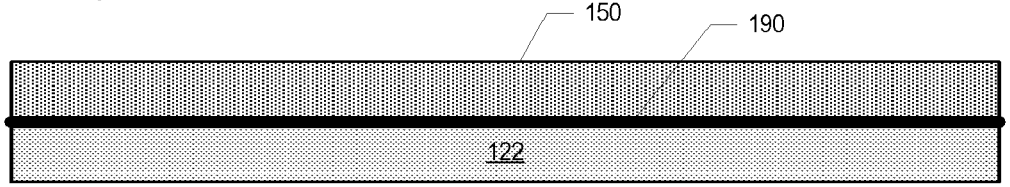

FIG. 9 illustrates an assembly 206 subsequent to providing a resist material 150 on the seed layer 190 of the assembly 204 (FIG. 8). In some embodiments, the resist material 150 may be a dry film resist, and may be laminated onto the assembly 204.

Figure 10:
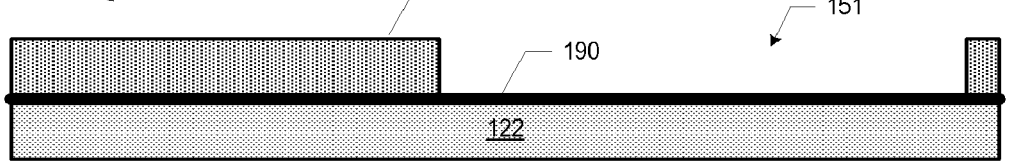

FIG. 10 illustrates an assembly 208 subsequent to patterning the resist material 150 of the assembly 206 (FIG. 9). The patterned resist material 150 may include a cavity 151 extending down to the seed layer 190. The footprint of the cavity 151 may be the footprint of the first plate 142, as discussed below.

Figure 11:
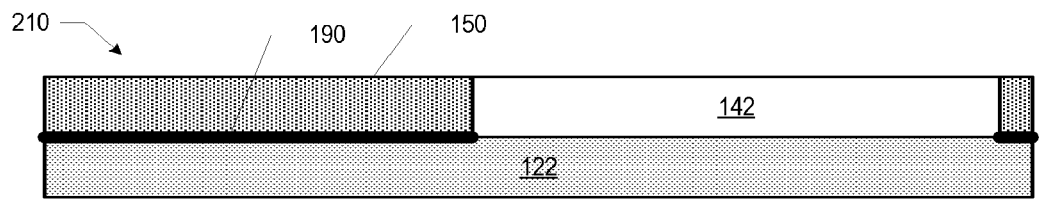

FIG. 11 illustrates an assembly 210 subsequent to providing additional conductive material in the cavity 151 of the assembly 208 (FIG. 10) to form the first plate 142. In some embodiments, the additional conductive material (e.g., copper) may be provided on the assembly 208 using an electroplating process in which the additional conductive material is formed on the exposed portion of the seed layer 190 in the cavity 151. The portion of the seed layer 190 on which the additional conductive material is grown is represented in FIG. 11 as part of the first plate 142, and, for illustrative purposes, not separately demarcated as the seed layer 190. The same drawing convention is applied in FIG. 31, discussed below.

Figure 12:
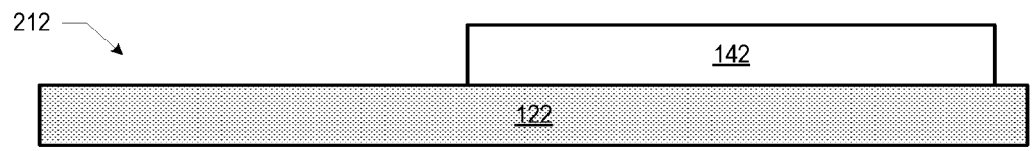

FIG. 12 illustrates an assembly 212 subsequent to removing the remaining resist material 150 and remaining seed layer 190 from the assembly 208 (FIG. 10). Any suitable technique may be used to remove a resist material (e.g., using tetramethylammonium hydroxide). Any suitable technique may be used to remove a remaining seed layer (e.g., etching with a combination of peroxide and sulfuric acid, or a combination of peroxide and a hydrofluoric solution, as appropriate). The first plate 142 is left disposed on the insulating material 122. FIGS. 7-12 may represent a semi-additive process for forming the first plate 142; in other embodiments, additive or subtractive processes may be performed instead of a semi-additive process.

Figure 13:

FIG. 13 illustrates an assembly 214 subsequent to providing additional insulating material 122 on the insulating material 122 and the first plate 142 of the assembly 212 (FIG. 12). The additional insulating material 122 may be provided using any suitable deposition process. For example, in some embodiments, the insulating material 122 may be laminated onto the assembly 212. If the feature heights of the assembly 212 are not excessively large, the insulating material 122 will be non-conformal over the assembly 212, and the upper surface of the insulating material 122 may provide a flat surface for further processing, as illustrated in FIG. 13.

Figure 14:
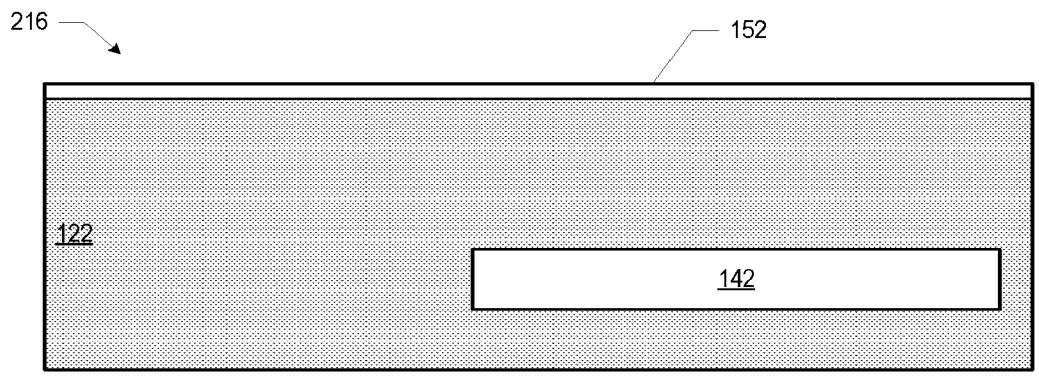

FIG. 14 illustrates an assembly 216 subsequent to providing a conductive material 152 on the insulating material 122 of the assembly 214 (FIG. 13). As discussed below, the source 128 and the drain 130 may be formed from the conductive material 152, and thus the conductive material 152 may take the form of any of the embodiments of the source 128 and drain 130 discussed herein. For example, the conductive material 152 may be copper. The conductive material 152 may be provided using any suitable technique. For example, in some embodiments, the conductive material 152 may be deposited on the insulating material 122 using an electroless wet process. In some embodiments, the conductive material 152 may be deposited on the insulating material 122 using a dry process, such as sputtering or plasma-enhanced chemical vapor deposition (PECVD).

Figure 15:
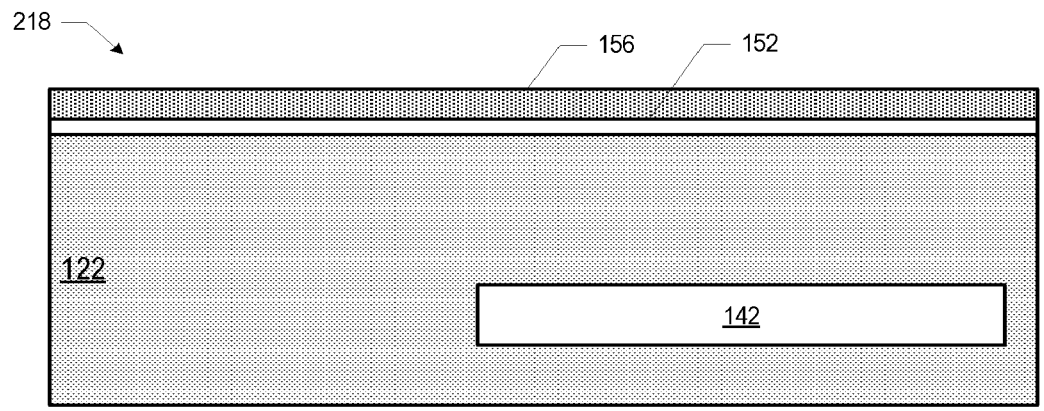

FIG. 15 illustrates an assembly 218 subsequent to providing a resist material 156 on the conductive material 152 of the assembly 216 (FIG. 14). In some embodiments, the resist material 156 may be a dry film resist, and may be laminated onto the assembly 216.

Figure 16:
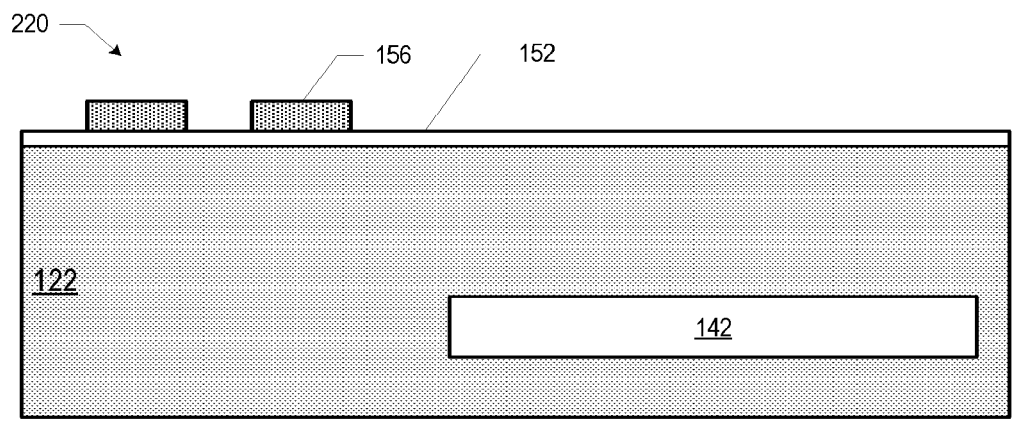

FIG. 16 illustrates an assembly 220 subsequent to patterning the resist material 156 of the assembly 218 (FIG. 15). The resist material 156 may be patterned so that the resist material 156 that remains corresponds to the footprints of the source 128 and the drain 130, as discussed below.

Figure 17:
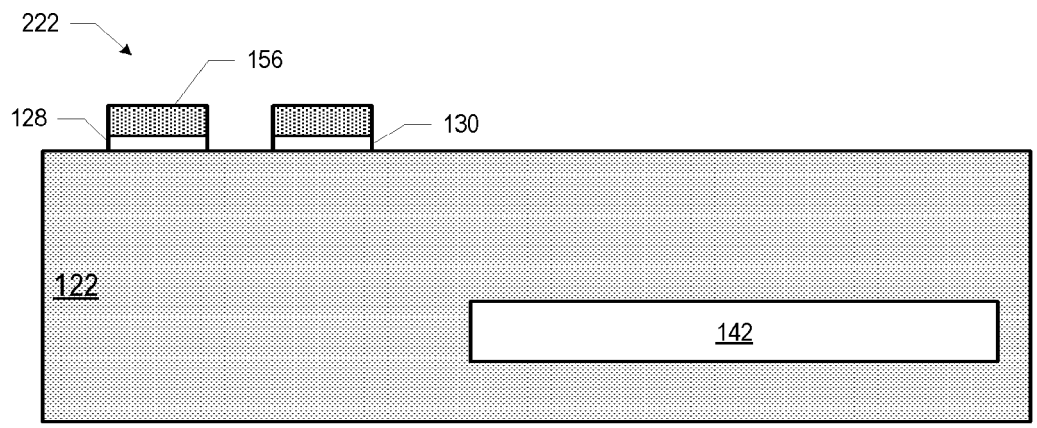

FIG. 17 illustrates an assembly 222 subsequent to etching the conductive material 152 of the assembly 220 (FIG. 16) in accordance with the patterned resist material 156. The technique used to etch the conductive material 152 may depend on the resist material 156; for example, in some embodiments, the etch may be an appropriate wet etch. All of the conductive material 152 not covered by the patterned resist material 156 may be etched away, as illustrated. The remaining conductive material 152 may provide the source 128 and the drain 130, as shown.

Figure 18:
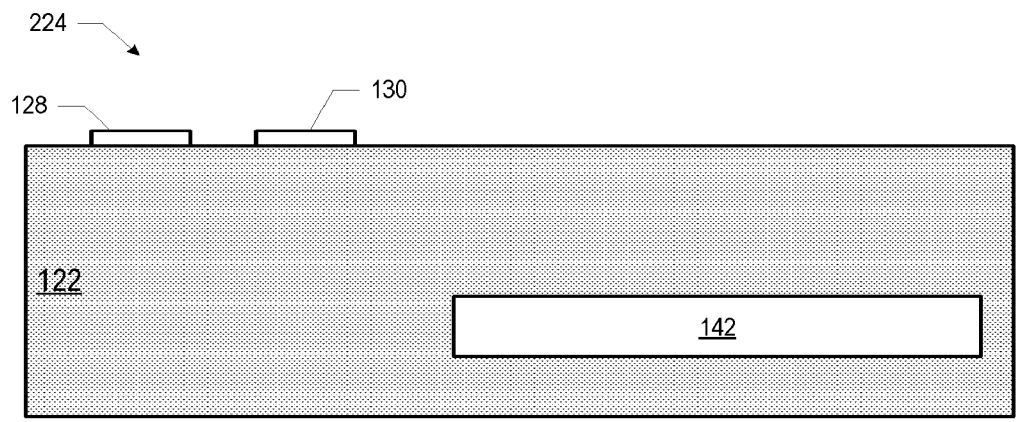

FIG. 18 illustrates an assembly 224 subsequent to removing the remaining resist material 156 from the assembly 222

(FIG. 17). The source 128 and the drain 130 are left disposed on the insulating material 122. FIGS. 14-18 may represent a subtractive process for forming the source 128 and the drain 130; in other embodiments, additive or semi-additive processes may be performed instead of a subtractive process.

Figure 19:
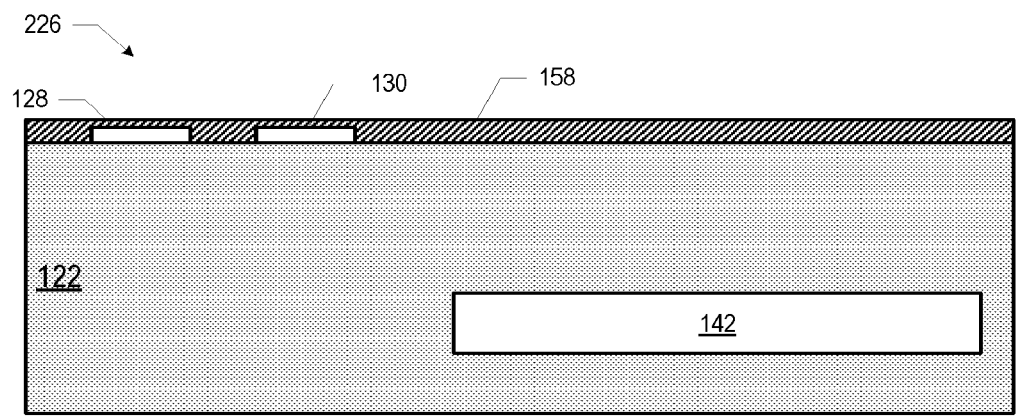

FIG. 19 illustrates an assembly 226 subsequent to providing a semiconductor material 158 on the source 128, drain 130, and insulating material 122 of the assembly 224 (FIG. 18). In some embodiments, the semiconductor material 158 may be blanket-deposited on the assembly 224. As discussed below, the semiconductor material 134 may be formed from the semiconductor material 158, and thus the semiconductor material 158 may take the form of any of the embodiments of the semiconductor material 134 discussed herein. The choice of the semiconductor material 158 (and thus the semiconductor material 134) may represent a balance between performance and the cost of deposition. For example, amorphous silicon may be more manufacturing intensive, but may also provide better electrical performance, than an organic semiconductor. In some embodiments, amorphous silicon may be provided as the semiconductor material 158 by chemical vapor deposition (CVD). In some embodiments, an organic semiconductor may be provided as the semiconductor material 158 by spin coating or slip coating.

Figure 20:
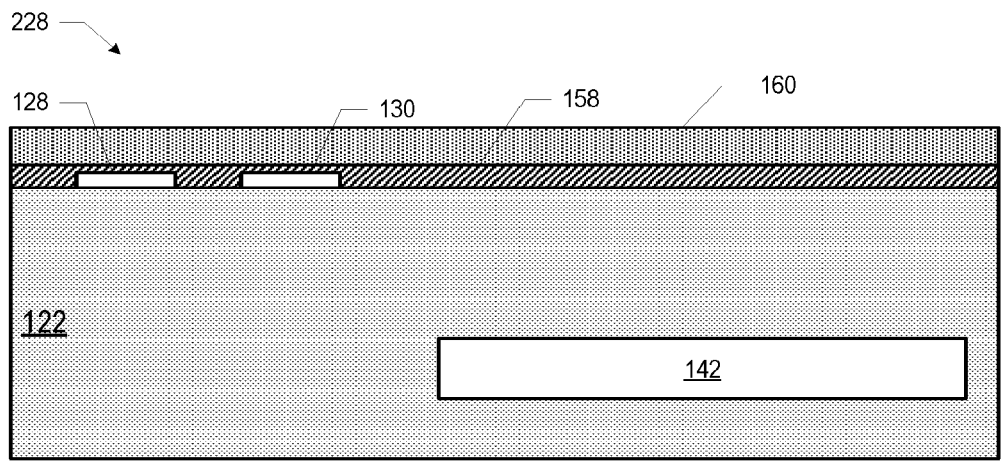

FIG. 20 illustrates an assembly 228 subsequent to providing a resist material 160 on the semiconductor material 158 of the assembly 226 (FIG. 19). In some embodiments, the resist material 160 may be a dry film resist, and may be laminated onto the assembly 226.

Figure 21:
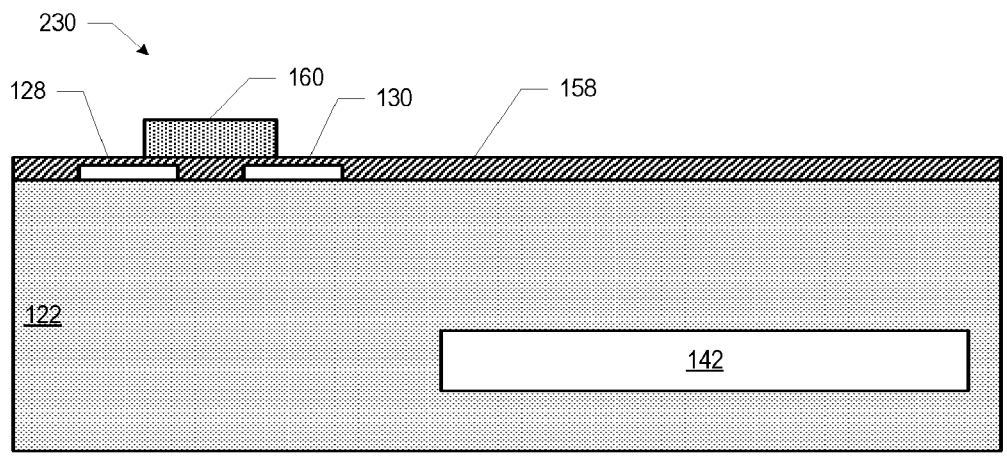

FIG. 21 illustrates an assembly 230 subsequent to patterning the resist material 160 of the assembly 228 (FIG. 20). The resist material 160 may be patterned so that the resist material 160 that remains corresponds to the footprint of the semiconductor material 134, as discussed below. The tolerance for the patterning of the resist material 160 may be more relaxed than the tolerance for the patterning of the resist material 156 (used to form the source 128 and the drain 130) since the channel length will have been defined by the formation of the source 128 and the drain 130.

Figure 22:
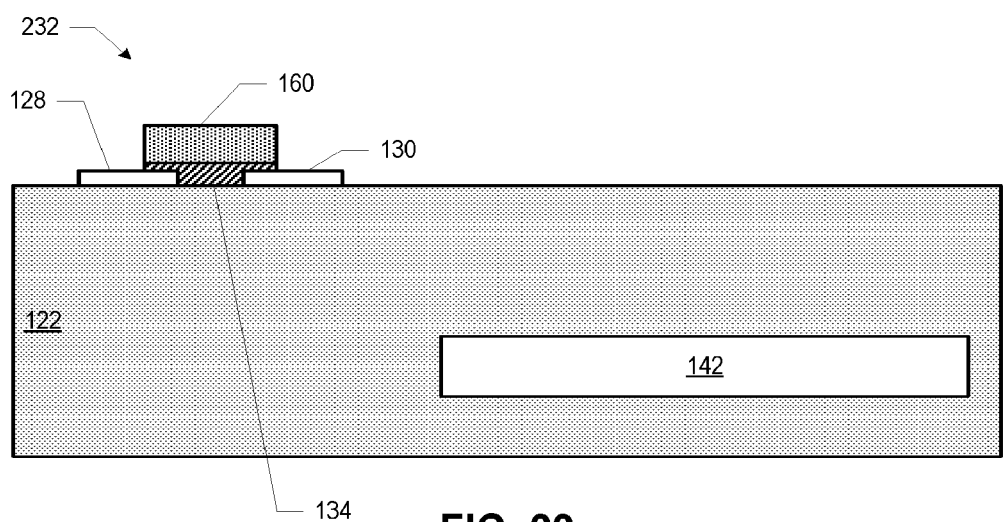

FIG. 22 illustrates an assembly 232 subsequent to etching the semiconductor material 158 of the assembly 230 (FIG. 21) in accordance with the patterned resist material 160. All of the semiconductor material 158 not covered by the patterned resist material 160 may be etched away, as illustrated. The remaining semiconductor material 158 may provide the semiconductor material 134, as shown.

Figure 23:
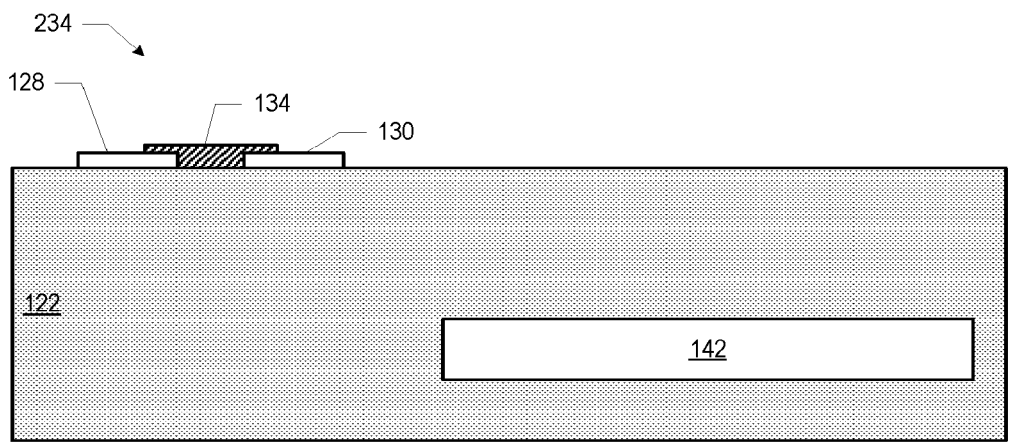

FIG. 23 illustrates an assembly 234 subsequent to removing the remaining resist material 160 from the assembly 232 (FIG. 22). The semiconductor material 134 may be left disposed on the insulating material 122, and on the source 128 and the drain 130. Like FIGS. 14-18, FIGS. 19-23 may represent a subtractive process for forming the semiconductor material 134; in other embodiments, additive or semi-additive processes may be performed instead of a subtractive process.

Figure 24:
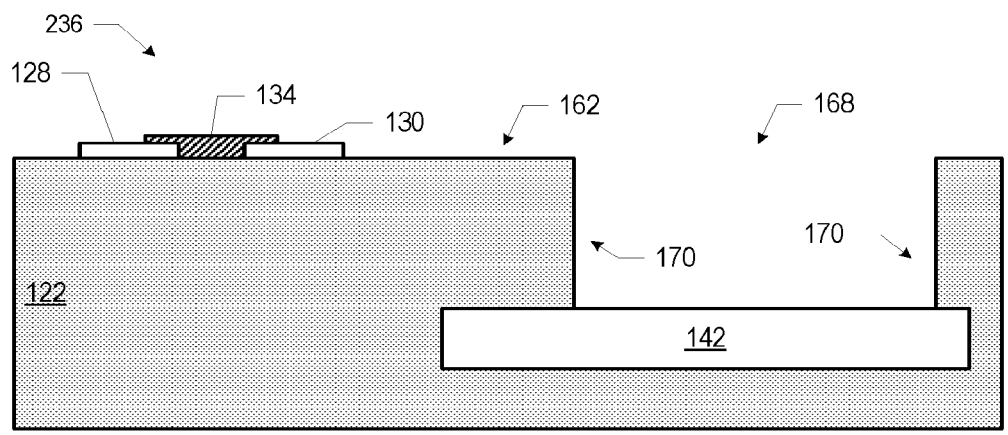

FIG. 24 illustrates an assembly 236 subsequent to forming a cavity 168 in the assembly 234 (FIG. 23). The cavity 168 may be formed in the face 162 of the insulating material 122 (the face on which the source 128, drain 130, and semiconductor material 134 are disposed) and may extend down to the first plate 142. The cavity 168 may have sidewalls 170 provided by the insulating material 122. Although the sidewalls 170 are illustrated in FIG. 24 as perpendicular to the face 162 (and the first plate 142), the cavity 168 may, in some embodiments, be tapered such that the sidewalls 170 are not perpendicular to the face 162. For example, in some embodiments, the cavity 168 may be tapered so as to narrow from the face 162 to the first plate 142. In some embodiments, the cavity 168 may be formed by laser scribing or skiving. The cavity 168 may have any suitable depth (e.g., as discussed above with reference to FIG. 5). For example, in some embodiments, the cavity 168 may have a depth between 25 and 30 microns.

Figure 25:
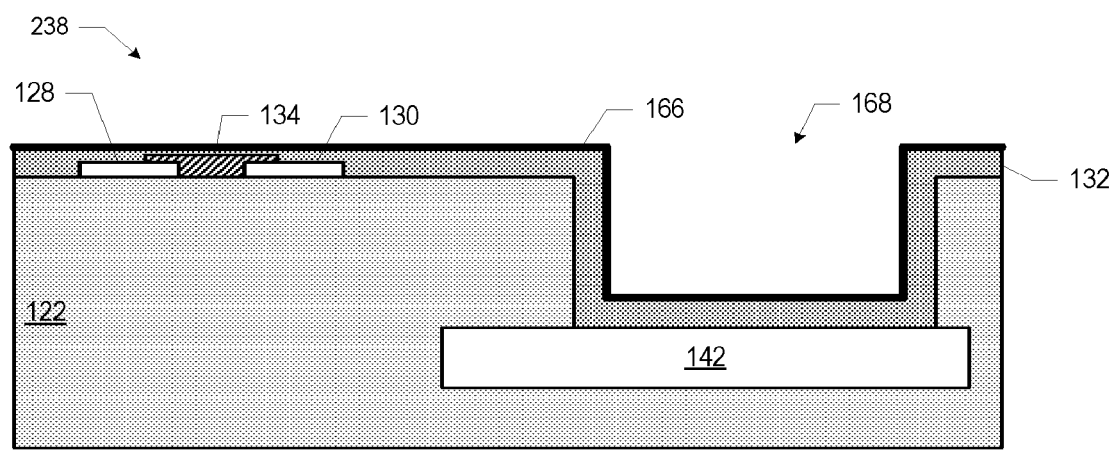

FIG. 25 illustrates an assembly 238 subsequent to providing a high-k dielectric material 132 to the assembly 236 (FIG. 24). The high-k dielectric material 132 may be provided over the face 162 of the insulating material 122; over the source 128, drain 130, and semiconductor material 134; over the sidewalls 170 of the cavity 168; and over the portion of the first plate 142 that forms the bottom of the cavity 168. In some embodiments, a protective film 166 may be disposed on the high-k dielectric material 132 such that the high-k dielectric material 132 is disposed between the protective film 166 and the insulating material 122. For example, in some embodiments, the high-k dielectric material 132 may be laminated onto the assembly 236, and the protective film 166 may accompany the high-k dielectric material as it is laminated and cured. The protective film 166 may be formed of polyethylene terephthalate (PET) or metallized PET, for example. In some embodiments, an adhesion promoter (not shown) may be disposed between the assembly 236 and the high-k dielectric material 132 to promote adhesion between the assembly 236 and the high-k dielectric material 132. The particular adhesion promoter used may depend on the high-k dielectric material 132 but, in some embodiments, may include silicon oxide or silicon nitride (deposited on the assembly 236 by, e.g., PECVD). In other embodiments, no protective film 166 may be disposed on the high-k dielectric material 132.

Figure 26:
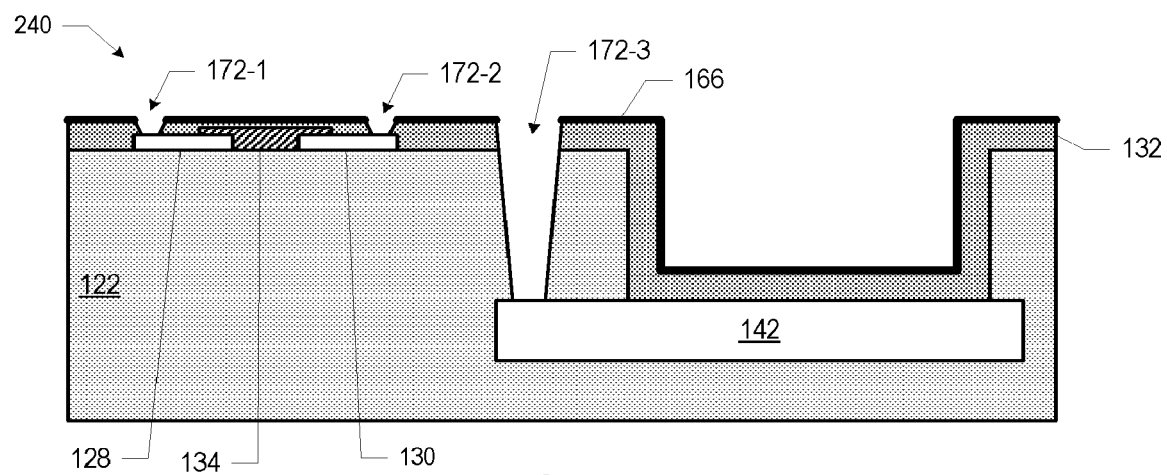

FIG. 26 illustrates an assembly 240 subsequent to forming openings 172 in the high-k dielectric material 132 of the assembly 238 (FIG. 25). The openings 172 may extend down to locations to which conductive contact is to be made, as discussed below. For example, in FIG. 26, the opening 172-1 extends down to the source 128, the opening 172-2 extends down to the drain 130, and the opening 172-3 extends down to the first plate 142. The openings 172 may be formed by any suitable process. For example, in some embodiments, the openings 172 may be formed by laser drilling. In some embodiments, the high-k dielectric material 132 may be photoimageable, and the openings 172 may be formed using photolithography. For example, the high-k dielectric material 132 may be a photoimageable dielectric (PID). In some embodiments, the insulating material 122 may also be a PID, and thus the portion of the opening 172 through the insulating material 122 may be formed by photoimaging; in other embodiments, that portion of the opening 172 may be formed by laser drilling, or another suitable technique. Forming the openings 172 by photoimaging, rather than laser drilling, may minimize the via residue that may be a byproduct of laser drilling (as well as minimize the surface roughening that may be a byproduct of attempting to remove via residue during a desmear process). In embodiments in which the protective film 166 is disposed on the high-k dielectric material 132, the protective film 166 may protect the high-k dielectric material 132 from any debris created when the openings 172 are formed.

Figure 27:
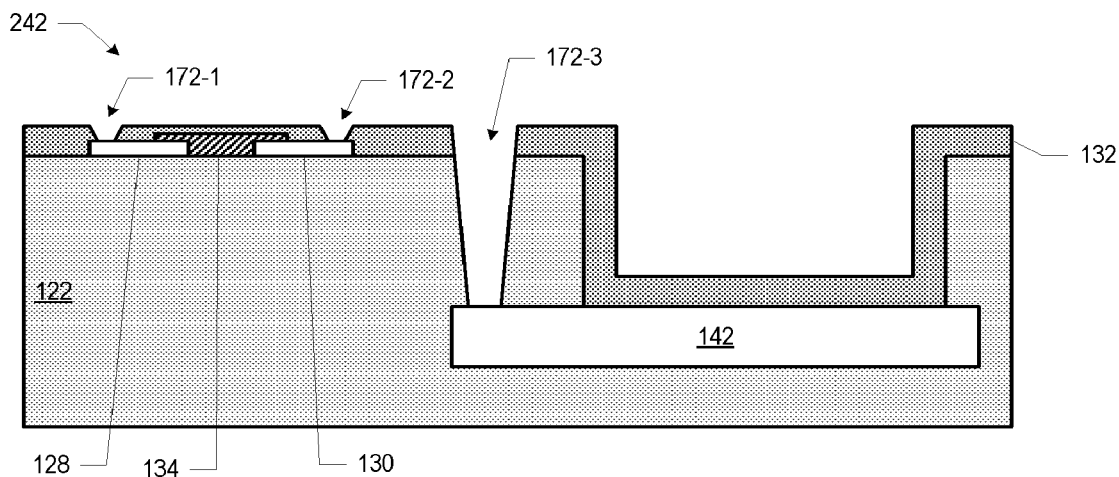

FIG. 27 illustrates an assembly 242 subsequent to removing the protective film 166 from the assembly 240 (FIG. 26). Removal of the protective film 166 may also remove debris created during the formation of the openings 172. The operation illustrated by FIG. 27 may not be performed in embodiments in which no protective film 166 is used.

Figure 28:
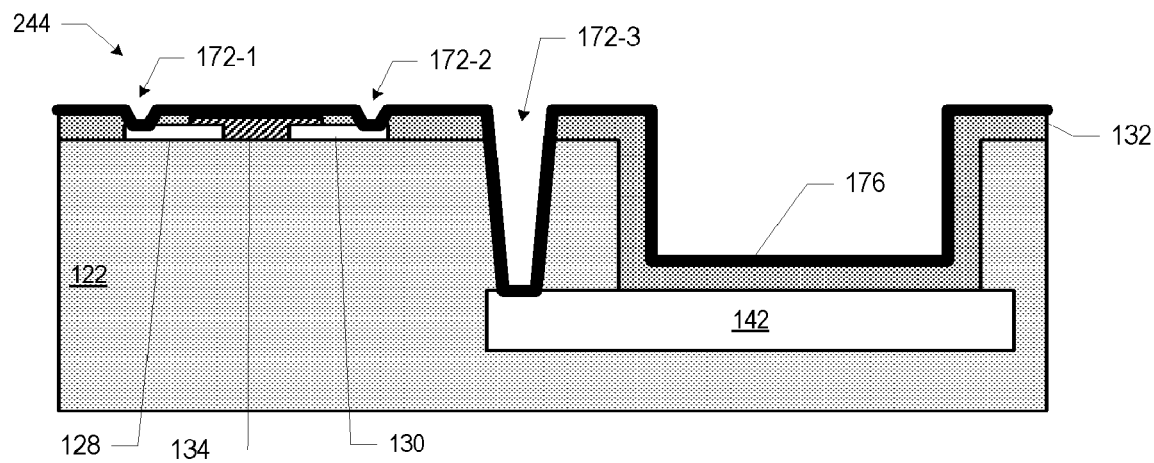

FIG. 28 illustrates an assembly 244 subsequent to providing a seed layer 176 of a conductive material on the assembly 242 (FIG. 27). The seed layer 176 may be a thin layer of the conductive material that will be used to form the second plate 144 of the capacitor 146, the gate 126 of the TFT 124, and the conductive contacts 138 of FIG. 6 (e.g., copper). In some embodiments, the seed layer 176 may be plated onto the assembly 242 using an electroless process.

Figure 29:
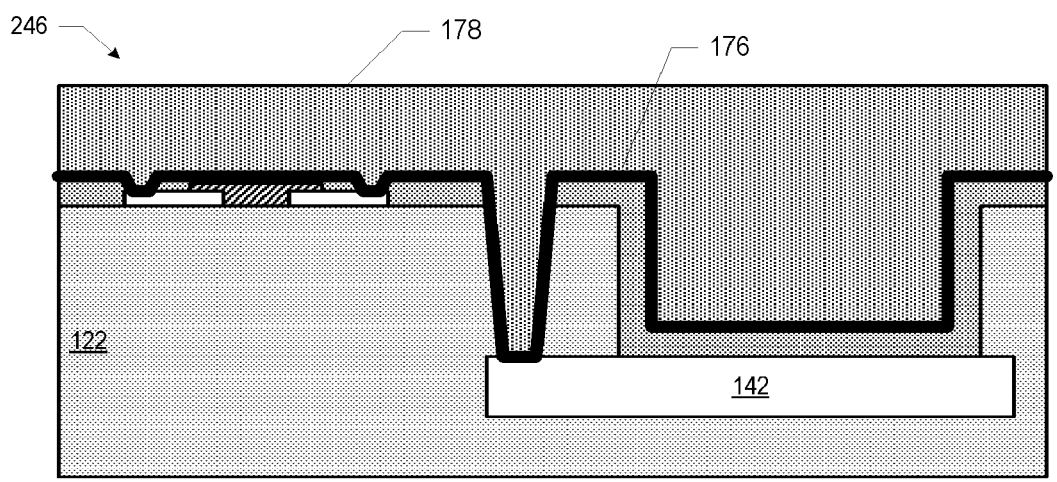

FIG. 29 illustrates an assembly 246 subsequent to providing a resist material 178 on the seed layer 176 of the assembly 244 (FIG. 28). In some embodiments, the resist material 178 may be a dry film resist and may be laminated onto the assembly 244.

Figure 30:
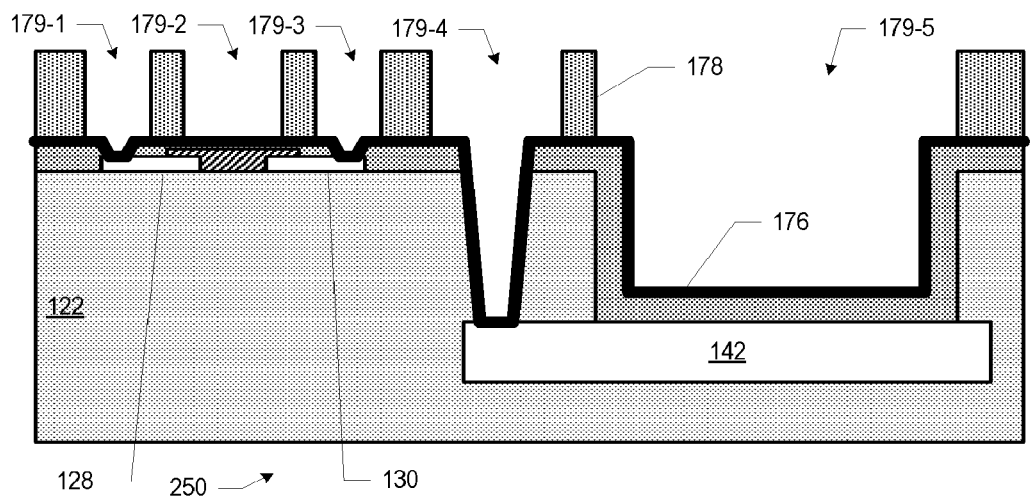

FIG. 30 illustrates an assembly 250 subsequent to patterning the resist material 178 of the assembly 246 (FIG. 29). The patterned resist material 178 may include cavities 179 extending down to the seed layer 176. The footprint of the cavity 179-1 may be the footprint of a conductive contact 138 to the source 128, the footprint of the cavity 179-2 may be the footprint of the gate 126, the footprint of the cavity 179-3 may be the footprint of a conductive contact 138 to the drain 130, the footprint of the cavity 179-4 may be the footprint of a conductive contact 138 to the first plate 142, and the footprint of the cavity 179-5 may be the footprint of the second plate 144, as discussed below.

Figure 31:
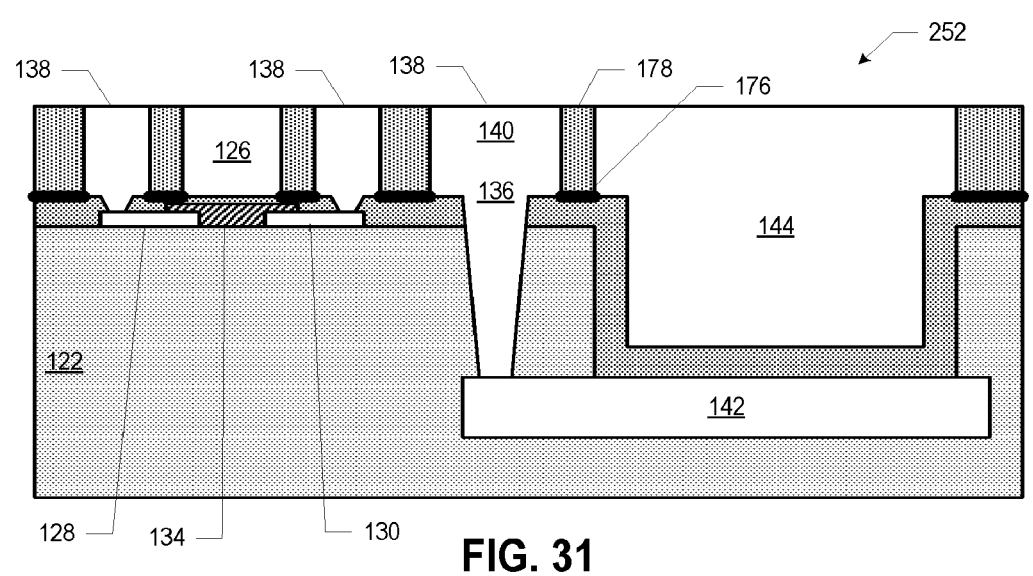

FIG. 31 illustrates an assembly 252 subsequent to providing additional conductive material in the cavities 179 of the assembly 250 (FIG. 30) to form the conductive contacts 138 to the source 128 and the drain 130, the gate 126, the conductive contact 138 to the first plate 142, and the second plate 144. In some embodiments, the additional conductive material (e.g., copper) may be provided on the assembly 250 using an electroplating process in which the additional conductive material is formed on the exposed portions of the seed layer in the cavities 179.

Figure 32:
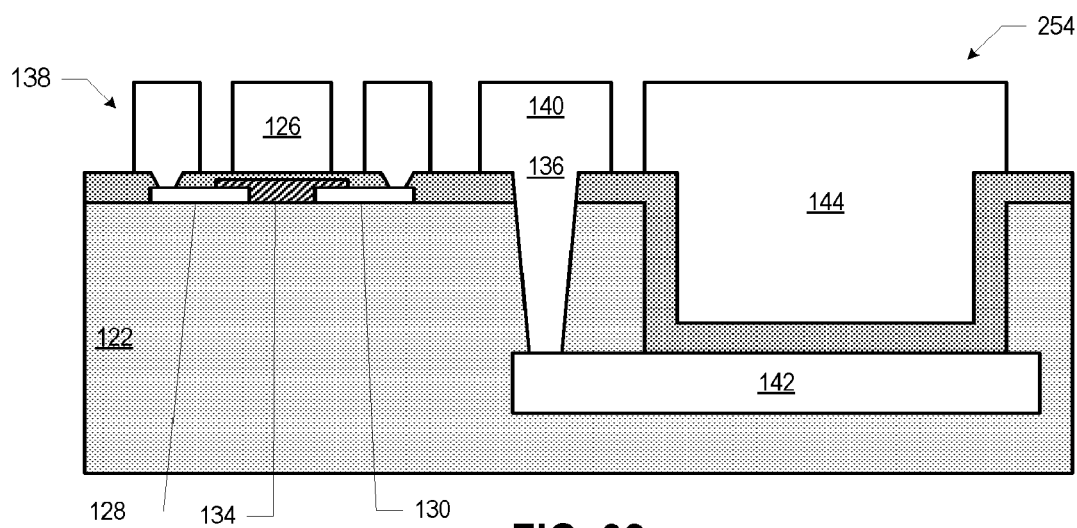

FIG. 32 illustrates an assembly 254 subsequent to removing the remaining resist material 178 and remaining seed layer 176 from the assembly 252 (FIG. 31). The conductive contacts 138 to the source 128, drain 130, and first plate 142 are left, as are the gate 126 and the second plate 144. FIGS. 28-32 may represent a semi-additive process for forming the conductive contacts 138, gate 126, and the second plate 144; in other embodiments, additive or subtractive processes may be performed instead of a semi-additive process.

Figure 33:
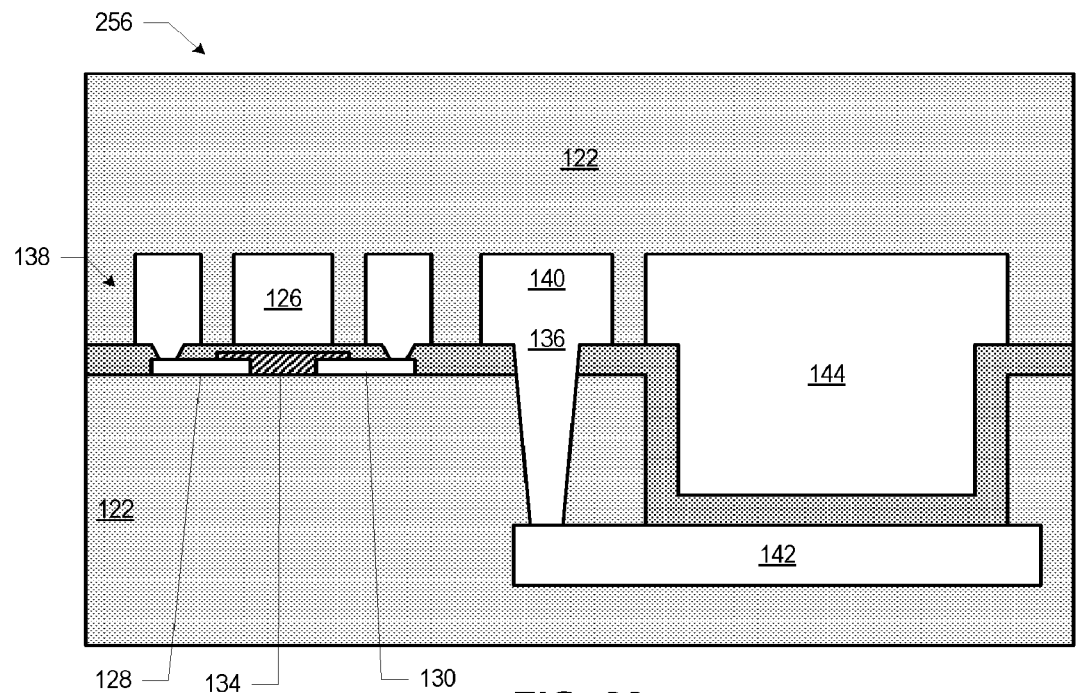

FIG. 33 illustrates an assembly 256 subsequent to providing additional insulating material 122 on the assembly 254 (FIG. 32). The additional insulating material 122 may be provided using any suitable deposition process, including any of the embodiments discussed above.

Figure 34:
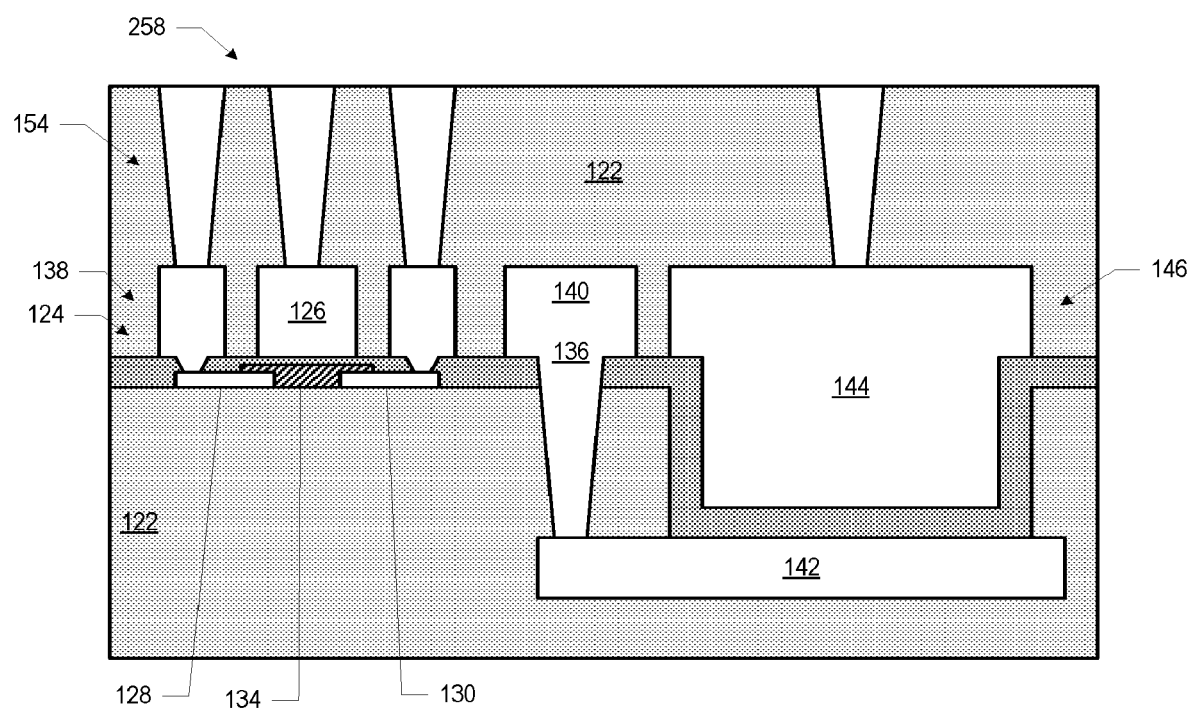

FIG. 34 illustrates an assembly 258 subsequent to forming additional conductive contacts 154 to various components in the assembly 256. The assembly 258 may have the structure of the integral device 112 of FIG. 6. The additional conductive contacts 154 may include conductive vias, conductive lines, or any combination of conductive vias and lines, and the operations discussed with reference to FIGS. 33 and 34 may be repeated as desired to form any suitable conductive pathways through the insulating material 122 to the TFT 124 and the capacitor 146. The operations discussed above with reference to FIGS. 7-34 may be repeated to form multiple layers of TFTs 124 and capacitors 146, in combination with any of the other embodiments disclosed herein, as desired. Additionally, conventional conductive pathways through the package substrate 110 may be formed simultaneously with the TFTs 124 and/or capacitors 146.

FIGS. 35-42 are cross-sectional side views of various stages in the manufacture of the TFT 124 of FIG. 2, in accordance with various embodiments. Although these figures illustrate particular manufacturing operations with reference to particular integral devices 112, the manufacturing operations discussed may be applied to form any other suitable embodiments of the integral devices 112. Additionally, although particular manufacturing techniques may be discussed or illustrated, alternative manufacturing techniques may also be used. For example, various operations discussed below may be part of semi-additive fabrication processes; in other embodiments, additive or subtractive processes may be used instead. Dimensions, shapes, material characteristics, and other features of the structures discussed below with reference to FIGS. 35-42 may take the form of any of the embodiments of those structures disclosed herein.

Figure 35:
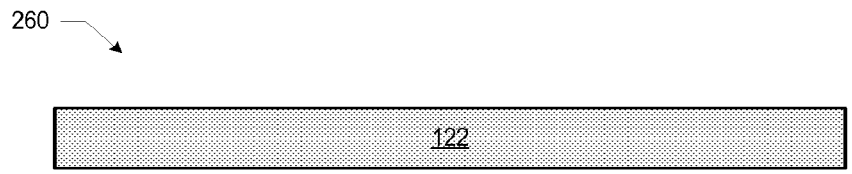
FIGS. 35-42 are cross-sectional side views of various stages in the manufacture of the TFT of FIG. 2, in accordance with various embodiments.

FIG. 35 illustrates an assembly 260 including an insulating material 122. The insulating material 122 of FIG. 35 may take the form of any of the embodiments of the insulating material 122 of FIG. 7, discussed above.

Figure 36:
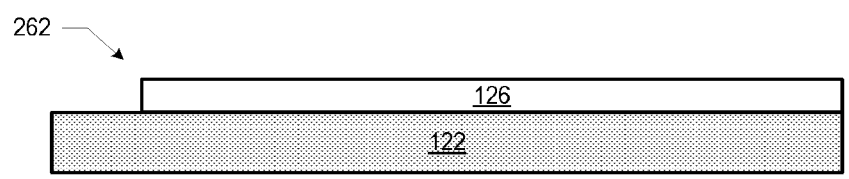

FIG. 36 illustrates an assembly 262 subsequent to providing a gate 126 on the insulating material 122 of the assembly 260 (FIG. 35). In some embodiments, the gate 126 may be formed using a semi-additive process as discussed above with reference to FIGS. 8-12 (or in accordance with any other embodiment discussed above with reference to FIGS. 8-12). Note that the gate 126 provided as shown in FIG. 36 could be provided simultaneously with a first plate 142 of the capacitor 146 of FIG. 4, for example. This illustrates one of many ways in which the process flows for forming a TFT 124, and a capacitor 146 may be integrated for simultaneous fabrication.

Figure 37:
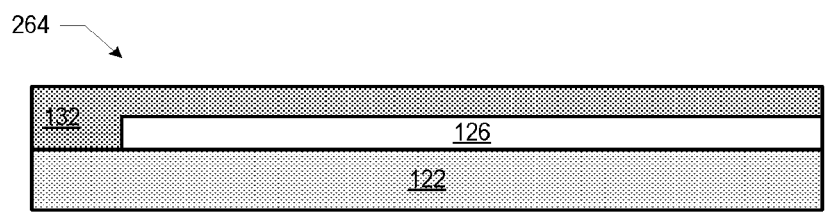

FIG. 37 illustrates an assembly 264 subsequent to providing a high-k dielectric material 132 on the assembly 262 (FIG. 36). The provision of the high-k dielectric material 132 in FIG. 37 may take the form of any of the embodiments discussed above with reference to FIG. 25. For example, in some embodiments, the high-k dielectric material 132 may be laminated onto the assembly 262. In some embodiments, the high-k dielectric material 132 may be accompanied by a protective film 166 (not shown in FIG. 37); the protective film 166 may be removed (e.g., by peeling) prior to further processing.

Figure 38:
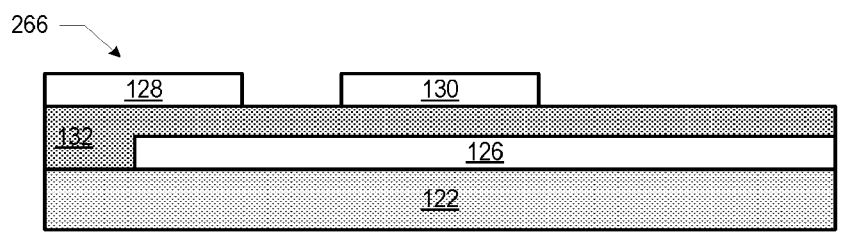

FIG. 38 illustrates an assembly 266 subsequent to providing a source 128 and a drain 130 on the high-k dielectric material 132 of the assembly 264 (FIG. 37). In some embodiments, the source 128 and the drain 130 may be formed using a subtractive process as discussed above with reference to FIGS. 14-18 (or in accordance with any other embodiment discussed above with reference to FIGS. 14-18). As discussed above with reference to FIG. 2, in some embodiments, an adhesion promoter may be provided on the high-k dielectric material 132 prior to provision of the source 128 and the drain 130. An adhesion promoter may be provided using any suitable technique. For example, titanium or another adhesion promoter may be sputtered onto the high-k dielectric material 132, and then a seed layer of the conductive material of the source 128 and the drain 130 (e.g., copper) may be sputtered onto the adhesion promoter to support subsequent electrodeposition of the conductive material. In some embodiments, if the thickness of the source 128/drain 130 is sufficiently small (e.g., less than 1 micron in some applications), the seed layer 190 may be deposited thick enough that additional conductive material need not be provided. In some embodiments, adhesion between the source 128/drain 130 and the high-k dielectric material 132 may be promoted by roughening the surface of the high-k dielectric material 132 with a desmear process, prior to providing the source 128 and the drain 130.

Figure 39:
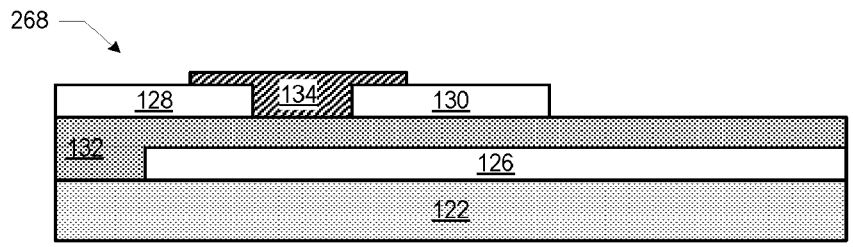

FIG. 39 illustrates an assembly 268 subsequent to providing a semiconductor material 134 on the high-k dielectric material 132 between the source 128 and the drain 130 of the assembly 266 (FIG. 38). In some embodiments, the semiconductor material 134 may be provided using a subtractive process, as discussed above with reference to FIGS. 19-23 (or in accordance with any other embodiment discussed above with reference to FIGS. 19-23).

Figure 40:
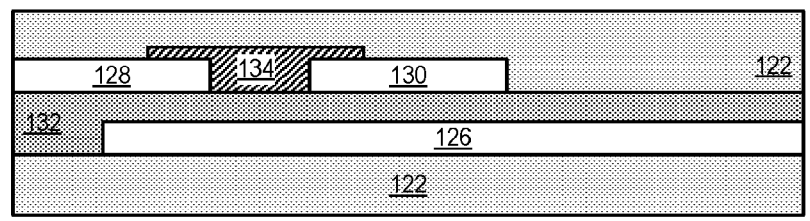

FIG. 40 illustrates an assembly 270 subsequent to providing additional insulating material 122 on the assembly 268 (FIG. 39). The additional insulating material 122 may be provided using any suitable deposition process. For example, in some embodiments, the insulating material 122 may be laminated onto the assembly 268. If the feature heights of the assembly 268 are not excessively large, the insulating material 122 will be non-conformal over the assembly 268, and the upper surface of the insulating material 122 may provide a flat surface for further processing, as illustrated in FIG. 40.

Figure 41:
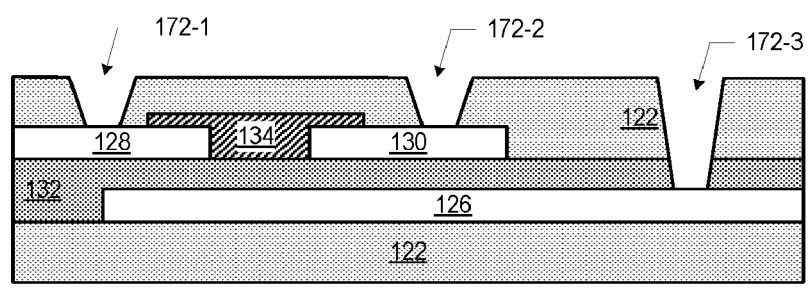

FIG. 41 illustrates an assembly 272 subsequent to forming openings 172 in the insulating material 122 (and the high-k dielectric material 132) of the assembly 270 (FIG. 40). The openings 172 may extend down to locations to which conductive contact is to be made, as discussed below. For example, in FIG. 41, the opening 172-1 extends down to the source 128, the opening 172-2 extends down to the drain 130, and the opening 172-3 extends down to the gate 126. The openings 172 of FIG. 41 may be formed in accordance with any of the techniques discussed above with reference to FIG. 26. For example, in some embodiments, the insulating material 122 may be photoimageable, and the openings 172 may be formed using photolithography. For example, the insulating material 122 may be a PID. In some embodiments, the high-k dielectric material 132 may also be a PID, and thus the portion of the opening 172 through the high-k dielectric material 132 may be formed by photoimaging; in other embodiments, that portion of the opening 172 may be formed by laser drilling, or another suitable technique.

Figure 42:
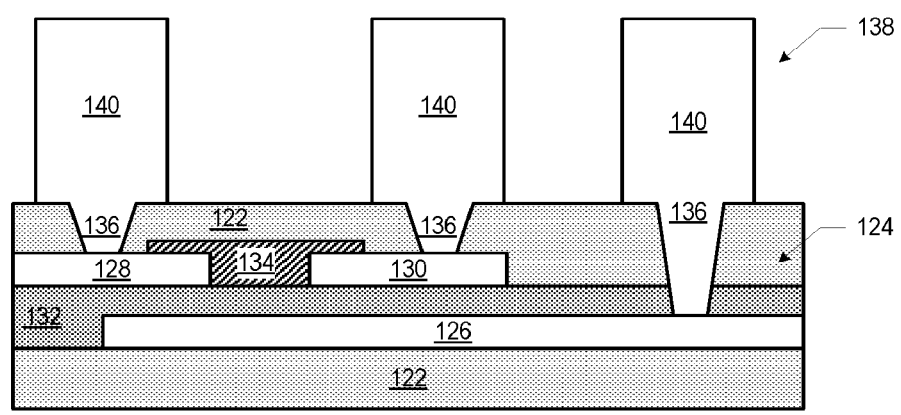

FIG. 42 illustrates an assembly 274 subsequent to forming conductive contacts 138 in the openings 172 of the assembly 272 (FIG. 41). The assembly 274 may have the structure of the integral device 112 of FIG. 2. In some embodiments, the conductive contacts 138 may be formed using a semi-additive process as discussed above with reference to FIGS. 28-32 (or in accordance with any other embodiment discussed above with reference to FIGS. 28-32). The operations discussed above with reference to FIGS. 35-42 may be repeated to form multiple layers of TFTs 124, in combination with any of the other embodiments disclosed herein, as desired. Additionally, conventional conductive pathways through the package substrate 110 may be formed simultaneously with the TFTs 124.

FIGS. 43-49 are cross-sectional side views of various stages in the manufacture of the capacitor 146 of FIG. 4, in accordance with various embodiments. Although these figures illustrate particular manufacturing operations with reference to particular integral devices 112, the manufacturing operations discussed may be applied to form any other suitable embodiments of the integral devices 112. Additionally, although particular manufacturing techniques may be discussed or illustrated, alternative manufacturing techniques may also be used. For example, various operations discussed below may be part of semi-additive fabrication processes; in other embodiments, additive or subtractive processes may be used instead. Dimensions, shapes, material characteristics, and other features of the structures discussed below with reference to FIGS. 43-49 may take the form of any of the embodiments of those structures disclosed herein.

Figure 43:
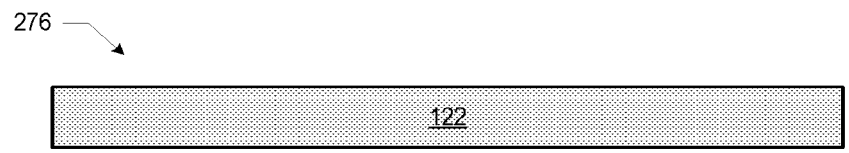
FIGS. 43-49 are cross-sectional side views of various stages in the manufacture of the capacitor of FIG. 4, in accordance with various embodiments.

FIG. 43 illustrates an assembly 276 including an insulating material 122. The insulating material 122 of FIG. 43 may take the form of any of the embodiments of the insulating material 122 of FIG. 7, discussed above.

Figure 44:
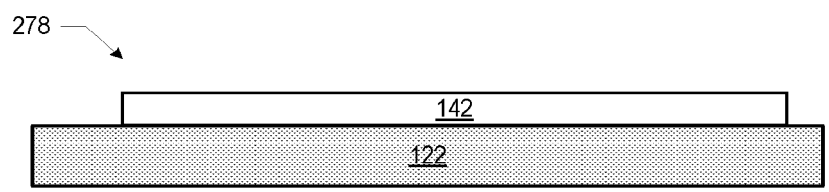

FIG. 44 illustrates an assembly 278 subsequent to providing a first plate 142 on the insulating material 122 of the assembly 276 (FIG. 43). In some embodiments, the first plate 142 may be formed using a semi-additive process as discussed above with reference to FIGS. 8-12 (or in accordance with any other embodiment discussed above with reference to FIGS. 8-12). Note that the first plate 142 provided as shown in FIG. 44 could be provided simultaneously with a gate 126 of the TFT 124 of FIG. 2, for example, as highlighted above.

Figure 45:
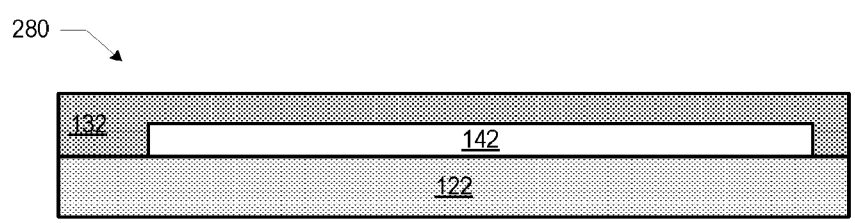

FIG. 45 illustrates an assembly 280 subsequent to providing a high-k dielectric material 132 on the assembly 278 (FIG. 44). The provision of the high-k dielectric material 132 in FIG. 45 may take the form of any of the embodiments discussed above with reference to FIG. 25. For example, in some embodiments, the high-k dielectric material 132 may be laminated onto the assembly 278. In some embodiments, the high-k dielectric material 132 may be accompanied by a protective film 166 (not shown in FIG. 45); the protective film 166 may be removed (e.g., by peeling) prior to further processing.

Figure 46:
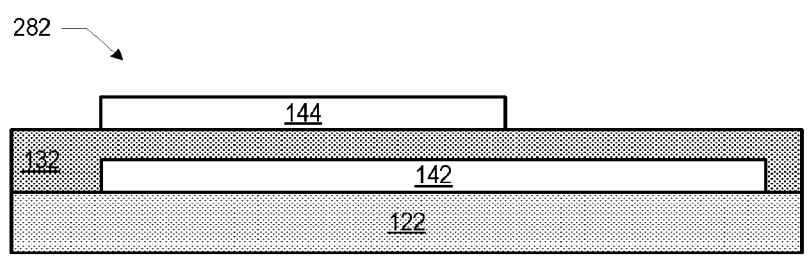

FIG. 46 illustrates an assembly 282 subsequent to providing a second plate 144 on the high-k dielectric material 132 of the assembly 280 (FIG. 45). In some embodiments, the second plate 144 may be provided using a subtractive process, as discussed above with reference to FIGS. 19-23 (or in accordance with any other embodiment discussed above with reference to FIGS. 19-23).

Figure 47:
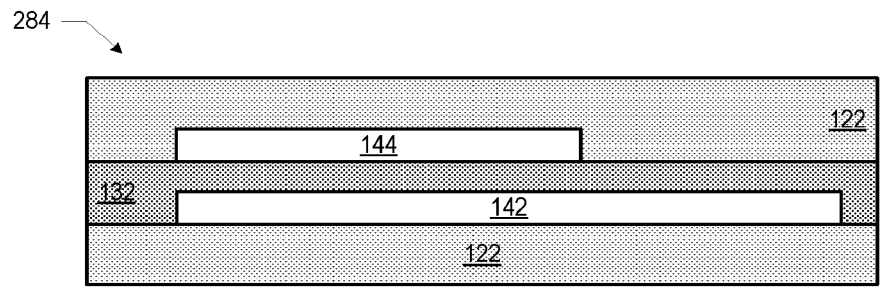

FIG. 47 illustrates an assembly 284 subsequent to providing additional insulating material 122 on the assembly 282 (FIG. 46). The additional insulating material 122 may be provided using any suitable deposition process, including any of the embodiments discussed above.

Figure 48:
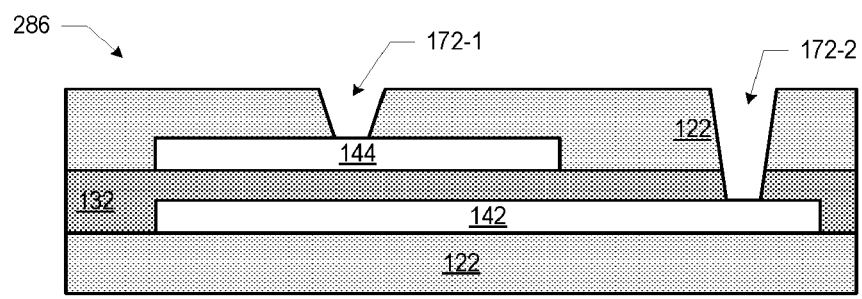

FIG. 48 illustrates an assembly 286 subsequent to forming openings 172 in the insulating material 122 (and the high-k dielectric material 132) of the assembly 284 (FIG. 47). The openings 172 may extend down to locations to which conductive contact is to be made, as discussed below. For example, in FIG. 48, the opening 172-1 may extend down to the second plate 144, and the opening 172-2 may extend down to the first plate 142. The openings 172 of FIG. 48 may be formed in accordance with any of the techniques discussed above with reference to FIG. 26.

Figure 49:
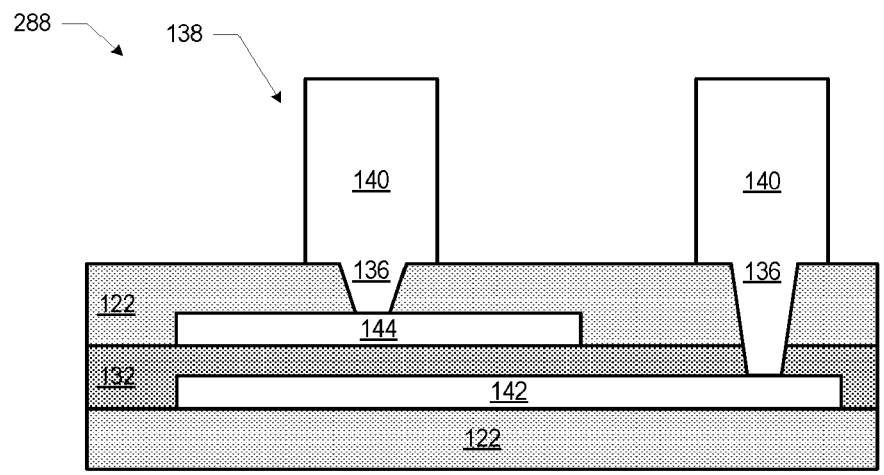

FIG. 49 illustrates an assembly 288 subsequent to forming conductive contacts 138 in the openings 172 of the assembly 286 (FIG. 48). The assembly 288 may have the structure of the integral device 112 of FIG. 4. In some embodiments, the conductive contacts 138 may be formed using a semi-additive process as discussed above with reference to FIGS. 28-32 (or in accordance with any other embodiment discussed above with reference to FIGS. 28-32). The operations discussed above with reference to FIGS. 43-49 may be repeated to form multiple layers of capacitors 146, in combination with any of the other embodiments disclosed herein, as desired. Additionally, conventional conductive pathways through the package substrate 110 may be formed simultaneously with the capacitors 146.

Figure 50:
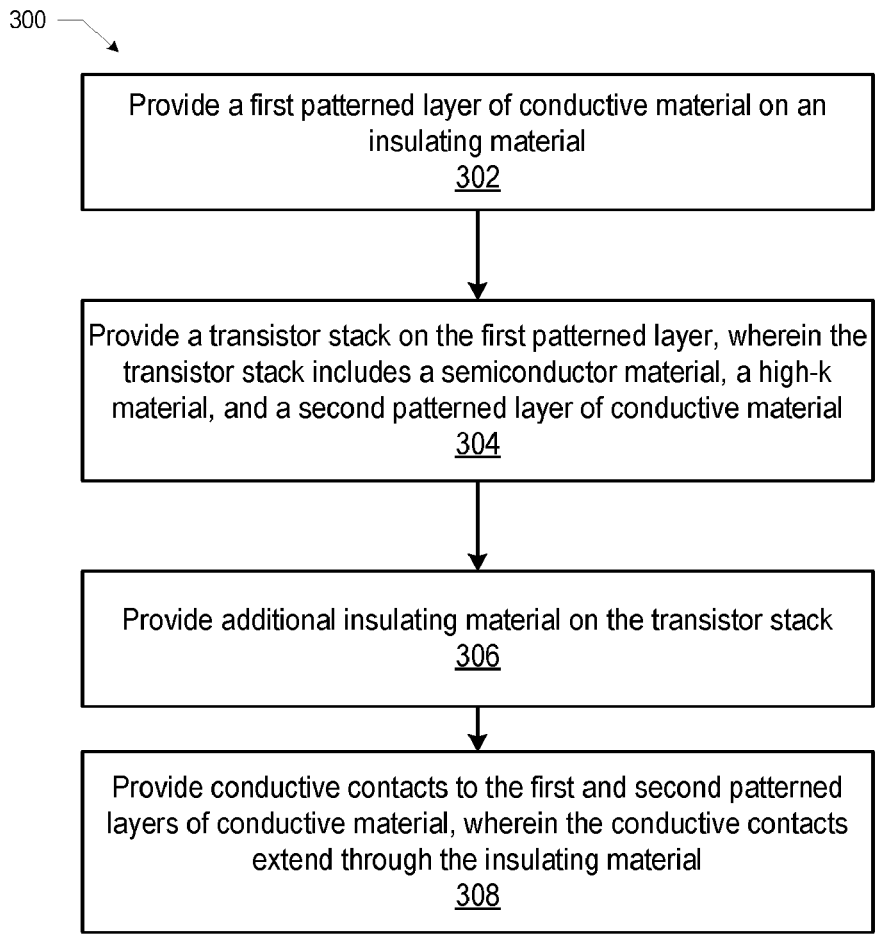
FIG. 50 is a flow diagram of an example method of manufacturing a package substrate including an integral device, in accordance with various embodiments.

FIG. 50 is a flow diagram of an example method 300 of manufacturing a package substrate including an integral device, in accordance with various embodiments. Although the various operations discussed with reference to the method 300 are shown in a particular order and once each, the operations may be performed in any suitable order (e.g., in any combination of parallel or series performance), and may be repeated or omitted as suitable. Additionally, although various operations of the method 300 may be illustrated with reference to particular embodiments of the integral devices 112 and the package substrate 110 disclosed herein, these are simply examples, and the method 300 may be used to form any suitable package substrate.

At 302, a first patterned layer of conductive material may be provided on an insulating material. For example, a gate 126 may be provided on the insulating material 122 (e.g., as illustrated in FIG. 2), or a source 128 and a drain 130 may be provided on the insulating material 122 (e.g., as illustrated in FIG. 3).

At 304, a transistor stack may be provided on the first patterned layer. The transistor stack may include a semiconductor material, a high-k dielectric material, and a second patterned layer of conductive material. For example, the semiconductor material 134 and the high-k dielectric material 132 may be provided on the gate 126 (e.g., as illustrated in FIG. 2, along with the source 128 and the drain 130) or on the source 128 and the drain 130 (e.g., as illustrated in FIG. 3, along with the gate 126).

At 306, additional insulating material may be provided on the transistor stack. For example, additional insulating material 122 may be provided above the TFTs 124 of FIGS. 2 and 3.

At 308, conductive contacts may be provided to the first and second patterned layers of conductive material. The conductive contacts may extend through the insulating material. For example, conductive contacts 138 may be provided to the source 128, the drain 130, and the gate 126 (although the conductive contact 138 to the gate 126 in the embodiment of FIG. 3 is not shown).

Figure 51:
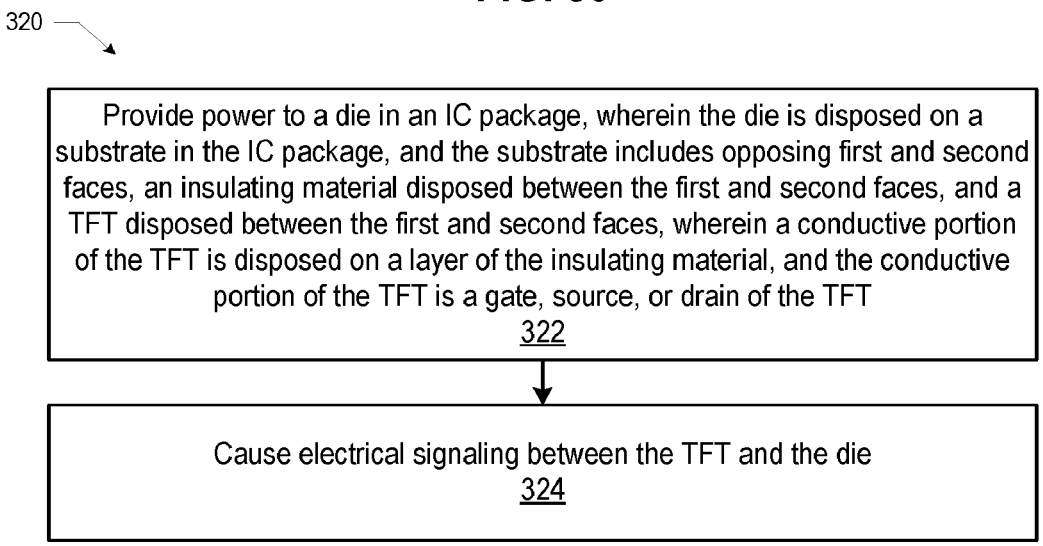
FIG. 51 is a flow diagram of an example method of operating an IC package, in accordance with various embodiments.

FIG. 51 is a flow diagram of an example method 320 of operating an IC package, in accordance with various embodiments. Although the various operations discussed with reference to the method 320 are shown in a particular order and once each, the operations may be performed in any suitable order (e.g., in any combination of parallel or series performance), and may be repeated or omitted as suitable. Additionally, although various operations of the method 320 may be illustrated with reference to particular embodiments of the integral devices 112 and the package substrate 110 disclosed herein, these are simply examples, and the method 320 may be used to operate any suitable IC package.

At 322, power may be provided to a die in an IC package. The die may be disposed on a substrate in the IC package, and the substrate may include opposing first and second faces, an insulating material disposed between the first and second faces, and a TFT disposed between the first and second faces. A conductive portion of the TFT may be disposed on a layer of the insulating material, and the conductive portion of the TFT may be a gate, source, or drain of the TFT. For example, a die 106 may be disposed on a package substrate 110 in an IC package 102. The package substrate 110 may include a first face 118 and an opposing second face 120, an insulating material 122 may be disposed between the first face 118 and the second face 120, and one or more TFTs 124 may be disposed between the first face 118 and the second face 120. A source 128, drain 130, or gate 126 of a TFT 124 may be disposed on a layer of the insulating material 122 (e.g., as illustrated in FIGS. 2 and 3).

At 324, electrical signaling may be caused between the TFT and the die. For example, power may be provided to the die 106 and the die 106 may initiate signaling with the TFT 124. In another example, the TFT may be part of a sensor circuit, and the die 106 may receive sensor signals from the sensor circuit. In another example, the TFT may be part of a power management circuit for the die 106, and the die 106 may manage its power consumption based on signals from the power management circuit.

The package substrates 110 disclosed herein may be included in any suitable electronic device. FIGS. 52-55 illustrate various examples of apparatuses that may be included in, or that may include, one or more of any of the package substrates 110 disclosed herein.

FIGS. 52A-B are top views of a wafer 5200 and dies 5202 that may be included in an IC package (e.g., the IC package 102) along with any of the package substrates 110 disclosed herein. The wafer 5200 may be composed of semiconductor material and may include one or more dies 5202 having IC elements formed on a surface of the wafer 5200. Each of the dies 5202 may be a repeating unit of a semiconductor product that includes any suitable IC. After the fabrication of the semiconductor product is complete, the wafer 5200 may undergo a singulation process in which each of the dies 5202 is separated from one another to provide discrete "chips" of the semiconductor product. The die 5202 may include one or more transistors (e.g., some of the transistors 5340 of FIG. 53, discussed below) and/or supporting circuitry to route electrical signals to the transistors, as well as any other IC components. In some embodiments, the wafer 5200 or the die 5202 may include a memory device (e.g., a static random access memory (SRAM) device), a logic device (e.g., AND, OR, NAND, or NOR gate), or any other suitable circuit element. Multiple ones of these devices may be combined on a single die 5202. For example, a memory array formed by multiple memory devices may be formed on a same die 5202 as a processing device (e.g., the processing device 5502 of FIG. 55) or other logic that is configured to store information in the memory devices or execute instructions stored in the memory array. In some embodiments, the die 5202 may include circuitry that is to couple to and interact with circuitry provided by integral devices 112 in the package substrate 110, after the die 5202 is coupled to the package substrate 110, as discussed above.

FIG. 53 is a cross-sectional side view of an IC device 5300 that may be included in a die that may be coupled to any of the package substrates 110 disclosed herein. In particular, one or more of the IC devices 5300 may be included in one or more dies 106. The IC device 5300 may be formed on a substrate 5302 (e.g., the wafer 5200 of FIG. 52A) and may be included in a die (e.g., the die 5202 of FIG. 52B). The substrate 5302 may be a semiconductor substrate composed of semiconductor material systems including, for example, N-type or P-type materials systems. The substrate 5302 may include, for example, a crystalline substrate formed using a bulk silicon or a silicon-on-insulator substructure. In some embodiments, the substrate 5302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 5302. Although a few examples of materials from which the substrate 5302 may be formed are described here, any material that may serve as a foundation for an IC device 5300 may be used. The substrate 5302 may be part of a singulated die (e.g., the dies 5202 of FIG. 52B) or a wafer (e.g., the wafer 5200 of FIG. 52A).

The IC device 5300 may include one or more device layers 5304 disposed on the substrate 5302. The device layer 5304 may include features of one or more transistors 5340 (e.g., metal oxide semiconductor field-effect transistors (MOSFETs)) formed on the substrate 5302. The device layer 5304 may include, for example, one or more source and/or drain (S/D) regions 5320, a gate 5322 to control current flow in the transistors 5340 between the S/D regions 5320, and one or more S/D contacts 5324 to route electrical signals to/from the S/D regions 5320. The transistors 5340 may include additional features not depicted for the sake of clarity, such as device isolation regions, gate contacts, and the like. The transistors 5340 are not limited to the type and configuration depicted in FIG. 53 and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 5340 may include a gate 5322 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 5340 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 5340 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 5320 may be formed within the substrate 5302 adjacent to the gate 5322 of each transistor 5340. The S/D regions 5320 may be formed using either an implantation/diffusion process or an etching/deposition process, for example. In the former process, dopants such as boron, aluminum, antimony, phosphorous, or arsenic may be ion-implanted into the substrate 5302 to form the S/D regions 5320. An annealing process that activates the dopants and causes them to diffuse farther into the substrate 5302 may follow the ion-implantation process. In the latter process, the substrate 5302 may first be etched to form recesses at the locations of the S/D regions 5320. An epitaxial deposition process may then be carried out to fill the recesses with material that is used to fabricate the S/D regions 5320. In some implementations, the S/D regions 5320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 5320 may be formed using one or more alternate semiconductor materials such as germanium or a group III-V material or alloy. In further embodiments, one or more layers of metal and/or metal alloys may be used to form the S/D regions 5320.

Electrical signals, such as power and/or input/output (I/O) signals, may be routed to and/or from the transistors 5340 of the device layer 5304 through one or more interconnect layers disposed on the device layer 5304 (illustrated in FIG. 53 as interconnect layers 5306-5310). For example, electrically conductive features of the device layer 5304 (e.g., the gate 5322 and the S/D contacts 5324) may be electrically coupled with the interconnect structures 5328 of the interconnect layers 5306-5310. The one or more interconnect layers 5306-5310 may form an interlayer dielectric (ILD) stack 5319 of the IC device 5300.

The interconnect structures 5328 may be arranged within the interconnect layers 5306-5310 to route electrical signals according to a wide variety of designs (in particular, the arrangement is not limited to the particular configuration of interconnect structures 5328 depicted in FIG. 53). Although a particular number of interconnect layers 5306-5310 is depicted in FIG. 53, embodiments of the present disclosure include IC devices having more or fewer interconnect layers than depicted.

In some embodiments, the interconnect structures 5328 may include trench structures 5328*a* (sometimes referred to as "lines") and/or via structures 5328*b* (sometimes referred to as "holes") filled with an electrically conductive material such as a metal. The trench structures 5328*a* may be arranged to route electrical signals in a direction of a plane that is substantially parallel with a surface of the substrate 5302 upon which the device layer 5304 is formed. For example, the trench structures 5328*a* may route electrical signals in a direction in and out of the page from the perspective of FIG. 53. The via structures 5328*b* may be arranged to route electrical signals in a direction of a plane that is substantially perpendicular to the surface of the substrate 5302 upon which the device layer 5304 is formed. In some embodiments, the via structures 5328*b* may electrically couple trench structures 5328*a* of different interconnect layers 5306-5310 together.

The interconnect layers 5306-5310 may include a dielectric material 5326 disposed between the interconnect structures 5328, as shown in FIG. 53. In some embodiments, the dielectric material 5326 disposed between the interconnect structures 5328 in different ones of the interconnect layers 5306-5310 may have different compositions; in other embodiments, the composition of the dielectric material 5326 between different interconnect layers 5306-5310 may be the same.

A first interconnect layer 5306 (referred to as Metal 1 or "M1") may be formed directly on the device layer 5304. In some embodiments, the first interconnect layer 5306 may include trench structures 5328*a* and/or via structures 5328*b*, as shown. The trench structures 5328*a* of the first interconnect layer 5306 may be coupled with contacts (e.g., the S/D contacts 5324) of the device layer 5304.

A second interconnect layer 5308 (referred to as Metal 2 or "M2") may be formed directly on the first interconnect layer 5306. In some embodiments, the second interconnect layer 5308 may include via structures 5328*b* to couple the trench structures 5328*a* of the second interconnect layer 5308 with the trench structures 5328*a* of the first interconnect layer 5306. Although the trench structures 5328*a* and the via structures 5328*b* are structurally delineated with a line within each interconnect layer (e.g., within the second interconnect layer 5308) for the sake of clarity, the trench structures 5328*a* and the via structures 5328*b* may be structurally and/or materially contiguous (e.g., simultaneously filled during a dual-damascene process) in some embodiments.

A third interconnect layer 5310 (referred to as Metal 3 or "M3") (and additional interconnect layers, as desired) may be formed in succession on the second interconnect layer 5308 according to similar techniques and configurations described in connection with the second interconnect layer 5308 or the first interconnect layer 5306.

The IC device 5300 may include a solder resist material 5334 (e.g., polyimide or similar material) and one or more bond pads 5336 formed on the interconnect layers 5306-5310. The bond pads 5336 may provide the contacts to couple to the first level interconnects 108, for example. The bond pads 5336 may be electrically coupled with the interconnect structures 5328 and configured to route the electrical signals of the transistor(s) 5340 to other external devices. For example, solder bonds may be formed on the one or more bond pads 5336 to mechanically and/or electrically couple a chip including the IC device 5300 with another component (e.g., a circuit board). The IC device 5300 may have other alternative configurations to route the electrical signals from the interconnect layers 5306-5310 than depicted in other embodiments. For example, the bond pads 5336 may be replaced by or may further include other analogous features (e.g., posts) that route the electrical signals to external components.

Figure 54:
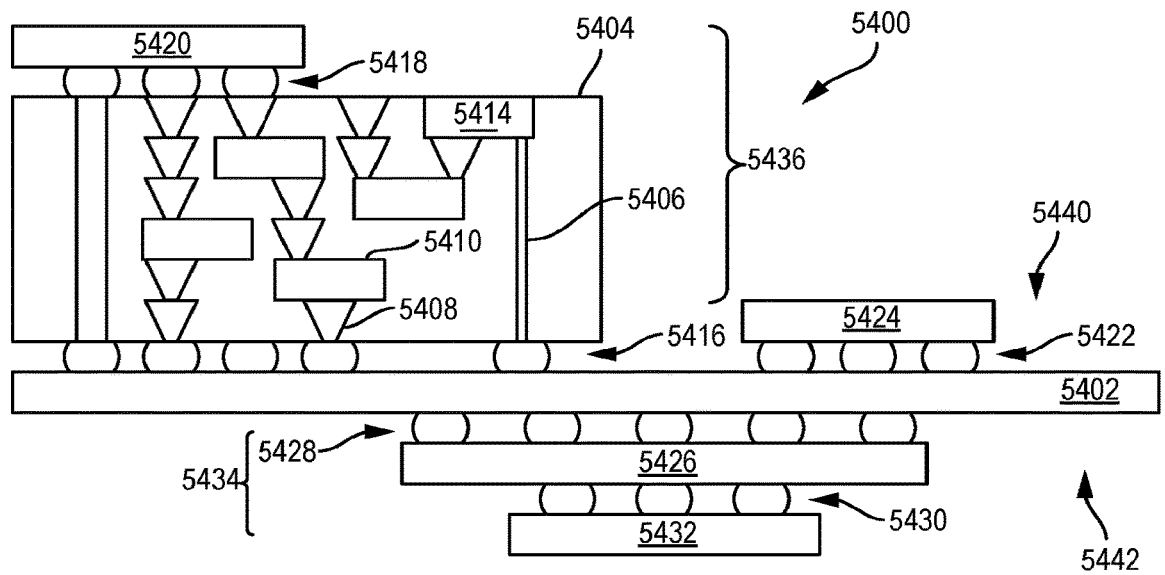
FIG. 54 is a cross-sectional side view of an IC device assembly that may include any of the embodiments of the package substrates disclosed herein.

FIG. 54 is a cross-sectional side view of an IC device assembly 5400 that may include any of the embodiments of the package substrates 110 disclosed herein. The IC device assembly 5400 includes a number of components disposed on a circuit board 5402 (which may be, e.g., the circuit board 104). The IC device assembly 5400 may include components disposed on a first face 5440 of the circuit board 5402 and an opposing second face 5442 of the circuit board 5402; generally, components may be disposed on one or both faces 5440 and 5442.

In some embodiments, the circuit board 5402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 5402. In other embodiments, the circuit board 5402 may be a non-PCB substrate.

The IC device assembly 5400 illustrated in FIG. 54 includes a package-on-interposer structure 5436 coupled to the first face 5440 of the circuit board 5402 by coupling components 5416. The coupling components 5416 may electrically and mechanically couple the package-on-interposer structure 5436 to the circuit board 5402, and may include solder balls (as shown in FIG. 54), male and female portions of a socket, an adhesive, an underfill material, and/or any other suitable electrical and/or mechanical coupling structure.

The package-on-interposer structure 5436 may include an IC package 5420 coupled to an interposer 5404 by coupling components 5418. The coupling components 5418 may take any suitable form for the application, such as the forms discussed above with reference to the coupling components 5416. For example, the coupling components 5418 may be the second level interconnects 114. Although a single IC package 5420 is shown in FIG. 54, multiple IC packages may be coupled to the interposer 5404; indeed, additional interposers may be coupled to the interposer 5404. The interposer 5404 may provide an intervening substrate used to bridge the circuit board 5402 and the IC package 5420. The IC package 5420 may be or include, for example, a die (the die 5202 of FIG. 52B), an IC device (e.g., the IC device 5300 of FIG. 53), or any other suitable component. In particular, the IC package 5420 may take any of the embodiments of the IC package 102 disclosed herein, and may include a package substrate 110 with one or more integral devices 112. Generally, the interposer 5404 may spread a connection to a wider pitch or reroute a connection to a different connection. For example, the interposer 5404 may couple the IC package 5420 (e.g., a die) to a ball grid array (BGA) of the coupling components 5416 for coupling to the circuit board 5402. In the embodiment illustrated in FIG. 54, the IC package 5420 and the circuit board 5402 are attached to opposing sides of the interposer 5404; in other embodiments, the IC package 5420 and the circuit board 5402 may be attached to a same side of the interposer 5404. In some embodiments, three or more components may be interconnected by way of the interposer 5404.

The interposer 5404 may be formed of an epoxy resin, a fiberglass-reinforced epoxy resin, a ceramic material, or a polymer material such as polyimide. In some embodiments, the interposer 5404 may be formed of alternate rigid or flexible materials that may include the same materials described above for use in a semiconductor substrate, such as silicon, germanium, and other group III-V and group IV materials. The interposer 5404 may include metal interconnects 5408 and vias 5410, including but not limited to through-silicon vias (TSVs) 5406. The interposer 5404 may further include embedded devices 5414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 5404. The package-on-interposer structure 5436 may take the form of any of the package-on-interposer structures known in the art.

The IC device assembly 5400 may include an IC package 5424 coupled to the first face 5440 of the circuit board 5402 by coupling components 5422. The coupling components 5422 may take the form of any of the embodiments discussed above with reference to the coupling components 5416, and the IC package 5424 may take the form of any of the embodiments discussed above with reference to the IC package 5420. In particular, the IC package 5424 may take the form of any of the embodiments of the IC package 102 disclosed herein, and may include a package substrate 110 with one or more integral devices 112.

The IC device assembly 5400 illustrated in FIG. 54 includes a package-on-package structure 5434 coupled to the second face 5442 of the circuit board 5402 by coupling components 5428. The package-on-package structure 5434 may include an IC package 5426 and an IC package 5432 coupled together by coupling components 5430 such that the IC package 5426 is disposed between the circuit board 5402 and the IC package 5432. The coupling components 5428 and 5430 may take the form of any of the embodiments of the coupling components 5416 discussed above, and the IC packages 5426 and 5432 may take the form of any of the embodiments of the IC package 5420 discussed above. In particular, the IC packages 5426 and 5432 may take any of the embodiments of the IC package 102 disclosed herein, and may include a package substrate 110 with one or more integral devices 112.

Figure 55:
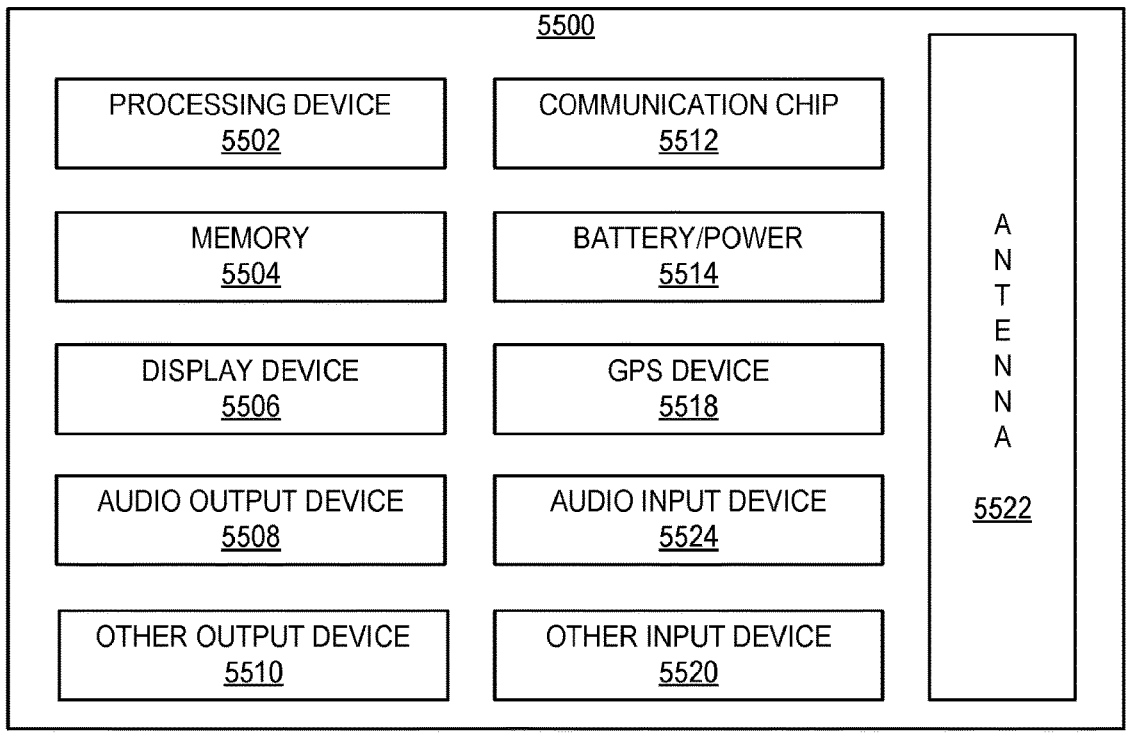
FIG. 55 is a block diagram of an example computing device that may include any of the embodiments of the package substrates disclosed herein.

FIG. 55 is a block diagram of an example computing device 5500 that may include one or more of the package substrates 110 disclosed herein. For example, any suitable ones of the components of the computing device 5500 may include, or be included in, an IC package 102 having a package substrate 110 including one or more integral devices 112, in accordance with any of the embodiments disclosed herein. A number of components are illustrated in FIG. 55 as included in the computing device 5500, but any one or more of these components may be omitted or duplicated, as suitable for the application. In some embodiments, some or all of the components included in the computing device 5500 may be attached to one or more motherboards. In some embodiments, some or all of these components are fabricated onto a single system-on-a-chip (SoC) die.

Additionally, in various embodiments, the computing device 5500 may not include one or more of the components illustrated in FIG. 55, but the computing device 5500 may include interface circuitry for coupling to the one or more components. For example, the computing device 5500 may not include a display device 5506, but may include display device interface circuitry (e.g., a connector and driver circuitry) to which a display device 5506 may be coupled. In another set of examples, the computing device 5500 may not include an audio input device 5524 or an audio output device 5508, but may include audio input or output device interface circuitry (e.g., connectors and supporting circuitry) to which an audio input device 5524 or audio output device 5508 may be coupled.

The computing device 5500 may include a processing device 5502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 5502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 5500 may include a memory 5504, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 5504 may include memory that shares a die with the processing device 5502. This memory may be used as cache memory and may include embedded dynamic random access memory (eDRAM) or spin transfer torque magnetic random-access memory (STT-M RAM).

In some embodiments, the computing device 5500 may include a communication chip 5512 (e.g., one or more communication chips). For example, the communication chip 5512 may be configured for managing wireless communications for the transfer of data to and from the computing device 5500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 5512 may implement any of a number of wireless standards or protocols, including but not limited to Institute for Electrical and Electronic Engineers (IEEE) standards including Wi-Fi (IEEE 5302.11 family), IEEE 5302.16 standards (e.g., IEEE 5302.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 5302.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 5302.16 standards. The communication chip 5512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 5512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 5512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 5512 may operate in accordance with other wireless protocols in other embodiments. The computing device 5500 may include an antenna 5522 to facilitate wireless communications and/or to receive other wireless communications (such as AM or FM radio transmissions).

In some embodiments, the communication chip 5512 may manage wired communications, such as electrical, optical, or any other suitable communication protocols (e.g., the Ethernet). As noted above, the communication chip 5512 may include multiple communication chips. For instance, a first communication chip 5512 may be dedicated to shorter-range wireless communications such as Wi-Fi or Bluetooth, and a second communication chip 5512 may be dedicated to longer-range wireless communications such as GPS, EDGE, GPRS, CDMA, WiMAX, LTE, EV-DO, or others. In some embodiments, a first communication chip 5512 may be dedicated to wireless communications, and a second communication chip 5512 may be dedicated to wired communications.

The computing device 5500 may include battery/power circuitry 5514. The battery/power circuitry 5514 may include one or more energy storage devices (e.g., batteries or capacitors) and/or circuitry for coupling components of the computing device 5500 to an energy source separate from the computing device 5500 (e.g., AC line power).

The computing device 5500 may include a display device 5506 (or corresponding interface circuitry, as discussed above). The display device 5506 may include any visual indicators, such as a heads-up display, a computer monitor, a projector, a touchscreen display, a liquid crystal display (LCD), a light-emitting diode display, or a flat panel display, for example.

The computing device 5500 may include an audio output device 5508 (or corresponding interface circuitry, as discussed above). The audio output device 5508 may include any device that generates an audible indicator, such as speakers, headsets, or earbuds, for example.

The computing device 5500 may include an audio input device 5524 (or corresponding interface circuitry, as discussed above). The audio input device 5524 may include any device that generates a signal representative of a sound, such as microphones, microphone arrays, or digital instruments (e.g., instruments having a musical instrument digital interface (MIDI) output).

The computing device 5500 may include a global positioning system (GPS) device 5518 (or corresponding interface circuitry, as discussed above). The GPS device 5518 may be in communication with a satellite-based system and may receive a location of the computing device 5500, as known in the art.

The computing device 5500 may include an other output device 5510 (or corresponding interface circuitry, as discussed above). Examples of the other output device 5510 may include an audio codec, a video codec, a printer, a wired or wireless transmitter for providing information to other devices, or an additional storage device.

The computing device 5500 may include an other input device 5520 (or corresponding interface circuitry, as discussed above). Examples of the other input device 5520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 5500 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 5500 may be any other electronic device that processes data.

The following paragraphs provide various examples of the embodiments disclosed herein.

Example 1 is an integrated circuit (IC) package, including: a substrate having opposing first and second faces, an insulating material disposed between the first and second faces, and a thin film transistor (TFT) disposed between the first and second faces, wherein a conductive portion of the TFT is disposed on a layer of the insulating material, and the conductive portion of the TFT is a gate, source, or drain of the TFT; and a die coupled to the first face of the substrate.

Example 2 may include the subject matter of Example 1, and may further specify that the die is electrically coupled to the TFT through the substrate.

Example 3 may include the subject matter of any of Examples 1-2, and may further specify that the substrate further includes electrical pathways between the first and second faces.

Example 4 may include the subject matter of any of Examples 1-3, and may further specify that the substrate further includes a capacitor disposed between the first and second faces.

Example 5 may include the subject matter of Example 4, and may further specify that at least some of the capacitor is coplanar with at least some of the TFT.

Example 6 may include the subject matter of any of Examples 4-5, and may further specify that the capacitor includes a high-k dielectric material having a higher dielectric constant than the insulating material.

Example 7 may include the subject matter of Example 6, and may further specify that an adhesion promoter is disposed between the high-k dielectric material and at least one plate of the capacitor.

Example 8 may include the subject matter of Example 7, and may further specify that the adhesion promoter includes silicon oxide or silicon nitride.

Example 9 may include the subject matter of Example 7, and may further specify that the adhesion promoter is an organic adhesion promoter.

Example 10 may include the subject matter of any of Examples 4-9, and may further specify that the capacitor includes first and second plates, and the second plate is thicker than the first plate.

Example 11 may include the subject matter of Example 10, and may further specify that a thickness of the first plate is equal to a thickness of the gate of the TFT.

Example 12 may include the subject matter of any of Examples 10-11, and may further specify that a thickness of the first plate is equal to a thickness of a conductive line in the substrate.

Example 13 may include the subject matter of any of Examples 10-11, and may further specify that a thickness of the first plate is equal to a sum of a thickness of a conductive line in the substrate and a thickness of a conductive via in the substrate.

Example 14 may include the subject matter of any of Examples 10-13, and may further specify that the first plate has an area between 0.0625 square millimeters and 1 square millimeter.

Example 15 may include the subject matter of any of Examples 1-14, and may further specify that a thickness of the gate, source, or drain of the TFT is equal to a thickness of a conductive line in the substrate.

Example 16 may include the subject matter of any of Examples 1-15, and may further specify that the conductive portion includes the source and drain of the TFT.

Example 17 may include the subject matter of any of Examples 1-16, and may further specify that the TFT includes a channel formed of a semiconductor material.

Example 18 may include the subject matter of Example 17, and may further specify that the semiconductor material includes amorphous silicon.

Example 19 may include the subject matter of Example 17, and may further specify that the semiconductor material includes an organic semiconductor material.

Example 20 may include the subject matter of any of Examples 1-19, and may further specify that the TFT includes a high-k dielectric material having a higher dielectric constant than the insulating material.

Example 21 may include the subject matter of Example 20, and may further specify that the TFT includes a channel formed of a semiconductor material, and the high-k dielectric material is disposed between the gate of the TFT and the channel of the TFT.

Example 22 may include the subject matter of any of Examples 20-21, and may further specify that the high-k dielectric material is photoimageable.

Example 23 may include the subject matter of any of Examples 1-22, and may further specify that the TFT is a first TFT, and the IC package further includes a second TFT, different from the first TFT.

Example 24 may include the subject matter of Example 23, and may further specify that the first TFT is spaced apart from the first face by a first distance, and the second TFT is spaced apart from the first face by the first distance.

Example 25 may include the subject matter of Example 23, and may further specify that the first TFT is spaced apart from the first face by a first distance, and the second TFT is spaced apart from the first face by a second distance different from the first distance.

Example 26 may include the subject matter of any of Examples 1-25, and may further specify that the conductive portion of the TFT has a thickness between 1 and 10 microns.

Example 27 may include the subject matter of Example 26, and may further specify that the conductive portion of the TFT has a thickness between 1 and 5 microns.

Example 28 may include the subject matter of any of Examples 1-27, and may further specify that the insulating material includes an organic material.

Example 29 may include the subject matter of Example 28, and may further specify that the insulating material is an epoxy-based insulating material.

Example 30 may include the subject matter of any of Examples 1-29, and may further specify that the die includes a processing device.

Example 31 is a computing device, including: a circuit board; and an integrated circuit (IC) package disposed on the circuit board, wherein the IC package includes: a substrate having opposing first and second faces, an insulating material disposed between the first and second faces, and a thin film transistor (TFT) disposed between the first and second faces, wherein a conductive portion of the TFT is disposed on a layer of the insulating material, and the conductive portion of the TFT is a gate, source, or drain of the TFT; and a die coupled to the first face of the substrate.

Example 32 may include the subject matter of Example 31, and may further specify that the TFT is part of a power management circuit.

Example 33 may include the subject matter of Example 31, and may further specify that the TFT is part of a sensor circuit.

Example 34 may include the subject matter of Example 31, and may further specify that the TFT is part of an input/output management circuit.

Example 35 is a method of manufacturing a substrate for an integrated circuit (IC) package, including: providing a first patterned layer of conductive material on an insulating material; providing a transistor stack on the first patterned layer, wherein the transistor stack includes a semiconductor material, a high-k dielectric material, and a second patterned layer of conductive material; providing additional insulating material on the transistor stack; and providing conductive contacts to the first and second patterned layers of conductive material, wherein the conductive contacts extend through the insulating material.

Example 36 may include the subject matter of Example 35, and may further specify that the first patterned layer of conductive material provides a transistor gate.

Example 37 may include the subject matter of Example 36, and may further specify that at least some of the second patterned layer of conductive material is disposed between the semiconductor material and the high-k dielectric material in the transistor stack.

Example 38 may include the subject matter of any of Examples 36-37, and may further specify that, after providing the transistor stack, at least some of the high-k dielectric material is disposed between the first patterned layer and the semiconductor material.

Example 39 may include the subject matter of any of Examples 35-38, and may further specify that the first patterned layer of conductive material provides a transistor source and a transistor drain.

Example 40 may include the subject matter of Example 39, and may further specify that at least some of the semiconductor material is disposed between the first patterned layer of conductive material and the high-k dielectric material.

Example 41 may include the subject matter of any of Examples 39-40, and may further specify that, after providing the transistor stack, at least some of the high-k dielectric material is disposed between the semiconductor material and the second patterned layer of conductive material.

Example 42 may include the subject matter of any of Examples 35-41, and may further specify that providing conductive contacts includes laser-drilling vias for the conductive contacts.

Example 43 may include the subject matter of any of Examples 35-41, and may further specify that providing conductive contacts includes using photolithography to open vias for the conductive contacts.

Example 44 may include the subject matter of any of Examples 35-43, and may further specify that providing the transistor stack includes laminating the high-k dielectric material.

Example 45 may include the subject matter of any of Examples 35 and 44, and may further specify that the transistor stack includes an adhesion promoter between the first patterned layer of conductive material and the high-k dielectric material.

Example 46 may include the subject matter of Example 45, and may further specify that the adhesion promoter includes silicon nitride or silicon oxide.

Example 47 may include the subject matter of any of Examples 35-46, and may further specify that providing the additional insulating material includes laminating the additional insulating material.

Example 48 may include the subject matter of any of Examples 35-47, and may further specify that, after provision, the additional insulating material provides a flat surface for further processing.

Example 49 may include the subject matter of any of Examples 35-48, and may further include providing a first plate for a capacitor in the insulating material; wherein the second patterned layer of conductive material includes a second plate for the capacitor, and the high-k dielectric material is at least partially disposed between the first and second plates.

Example 50 may include the subject matter of Example 49, and may further include forming a cavity in the insulating material, a trench extending down to the first plate; wherein the high-k dielectric material is at least partially disposed in the trench, and the second patterned layer of conductive material is at least partially disposed in the trench.

Example 51 may include the subject matter of Example 50, and may further specify that forming the cavity includes using a laser to remove some of the insulating material.

Example 52 may include the subject matter of Example 51, and may further specify that forming the cavity includes laser scribing or skiving.

Example 53 may include the subject matter of any of Examples 49-52, and may further specify that: providing the transistor stack includes providing the high-k dielectric material with a protective film; and providing conductive contacts includes: forming vias in the insulating material while the protective film is in place on the high-k dielectric material, and removing the protective film before providing the second patterned layer of conductive material.

Example 54 is a method of operating an integrated circuit (IC) package, including: providing power to a die in the IC package, wherein the die is disposed on a substrate in the IC package, and the substrate includes opposing first and second faces, an insulating material disposed between the first and second faces, and a thin film transistor (TFT) disposed between the first and second faces, wherein a conductive portion of the TFT is disposed on a layer of the insulating material, and the conductive portion of the TFT is a gate, source, or drain of the TFT; and causing electrical signaling between the TFT and the die.

Example 55 may include the subject matter of Example 54, and may further specify that the TFT is part of a circuit that manages power for the die.

Example 56 may include the subject matter of Example 54, and may further specify that the TFT is part of a sensor circuit, and causing electrical signaling between the TFT and the die includes receiving sensor signals from the sensor circuit at the die.

Example 57 may include the subject matter of any of Examples 54-56, and may further specify that the substrate further includes a capacitor disposed between the first and second faces.

The invention claimed is:

1. An integrated circuit (IC) package, comprising:
a substrate having opposing first and second faces, an insulating material between the first face and the second face, and a thin film transistor (TFT) between the first face and the second face, wherein a conductive portion of the TFT is on a layer of the insulating material, and the conductive portion of the TFT is a gate, source, or drain of the TFT; and
a die coupled to the first face of the substrate;
wherein the substrate further includes a capacitor between the first face and the second face, the capacitor includes first and second plates, and the second plate is thicker than the first plate; and
wherein the TFT includes a high-k dielectric material having a higher dielectric constant than the insulating material, the TFT includes a channel including a semiconductor material, and the high-k dielectric material is between the gate of the TFT and the channel of the TFT.

2. The IC package of claim 1, wherein the die is electrically coupled to the TFT through the substrate.

3. The IC package of claim 1, wherein the substrate further includes electrical pathways between the first face and the second face.

4. The IC package of claim 1, wherein at least some of the capacitor is coplanar with at least some of the TFT.

5. The IC package of claim 1, wherein a thickness of the first plate is equal to a thickness of the gate of the TFT.

6. The IC package of claim 1, wherein a thickness of the first plate is equal to a thickness of a conductive line in the substrate.

7. The IC package of claim 1, wherein a thickness of the first plate is equal to a sum of a thickness of a conductive line in the substrate and a thickness of a conductive via in the substrate.

8. The IC package of claim 1, wherein a thickness of the gate, source, or drain of the TFT is equal to a thickness of a conductive line in the substrate.

9. The IC package of claim 1, wherein the TFT is a first TFT, and the IC package further includes:
a second TFT, different from the first TFT, wherein the first TFT is spaced apart from the first face by a first distance, and the second TFT is spaced apart from the first face by a second distance different from the first distance.

10. A computing device, comprising:
a circuit board; and
an integrated circuit (IC) package on the circuit board, wherein the IC package includes:
a substrate having opposing first and second faces, an insulating material between the first face and the second face, and a thin film transistor (TFT) between the first face and the second face, wherein a conductive portion of the TFT is on a layer of the insulating material, and the conductive portion of the TFT is a gate, source, or drain of the TFT; and
a die coupled to the first face of the substrate;
wherein the substrate further includes a capacitor between the first face and the second face, the capacitor includes first and second plates, and the second plate is thicker than the first plate; and
wherein the TFT includes a high-k dielectric material having a higher dielectric constant than the insulating material, the TFT includes a channel including a semiconductor material, and the high-k dielectric material is between the gate of the TFT and the channel of the TFT.

11. The computing device of claim 10, wherein the TFT is part of a power management circuit, a sensor circuit, or an input/output management circuit.

12. An integrated circuit (IC) package, comprising:
a substrate having opposing first and second faces, an insulating material between the first face and the second face, and a thin film transistor (TFT) between the first face and the second face, wherein a conductive portion of the TFT is on a layer of the insulating material, and the conductive portion of the TFT is a gate, source, or drain of the TFT; and
a die coupled to the first face of the substrate;
wherein the substrate further includes a capacitor between the first face and the second face, the substrate further includes a conductive line between the first face and the second face, the substrate further includes a conductive via between the first face and the second face, and a thickness of a plate of the capacitor is equal to a sum of a thickness of the conductive line in the substrate and a thickness of the conductive via in the substrate.

13. The IC package of claim 12, wherein the capacitor includes a dielectric material having a higher dielectric constant than the insulating material.

14. The IC package of claim 13, wherein a material is between the dielectric material and at least one plate of the capacitor, and the material includes silicon and oxygen, silicon and nitrogen, or carbon.

15. The IC package of claim 12, wherein the TFT includes an organic semiconductor material.

16. The IC package of claim 12, wherein the conductive portion of the TFT has a thickness between 1 and 10 microns.

17. An integrated circuit (IC) package, comprising:
a substrate including:
opposing first and second faces,
an insulating material between the first face and the second face,
a first thin film transistor (TFT) between the first face and the second face,
a second TFT, different from the first TFT, between the first face and the second face,
wherein a conductive portion of the first TFT is on a layer of the insulating material, and the conductive portion of the first TFT is a gate, source, or drain of the TFT, and
wherein the first TFT is spaced apart from the first face by a first distance, and the second TFT is spaced apart from the first face by a second distance different from the first distance; and
a die coupled to the first face of the substrate;
wherein the substrate further includes a capacitor between the first face and the second face, the capacitor includes first and second plates, and the second plate is thicker than the first plate.

18. The IC package of claim 17, wherein a thickness of the first plate is equal to a sum of a thickness of a conductive line in the substrate and a thickness of a conductive via in the substrate.

19. The IC package of claim 17, wherein the first TFT includes a high-k dielectric material having a higher dielectric constant than the insulating material, the TFT includes a channel including a semiconductor material, and the high-k dielectric material is between the gate of the TFT and the channel of the TFT.

20. The IC package of claim 17, wherein the insulating material includes an organic material.

21. The IC package of claim 17, wherein the insulating material includes an epoxy.

22. The IC package of claim 17, wherein the first TFT includes a photoimageable dielectric material.

23. The IC package of claim 17, wherein a thickness of the first plate is equal to a sum of a thickness of a conductive line in the substrate and a thickness of a conductive via in the substrate.

* * * * *

UNITED STATES PATENT AND TRADEMARK OFFICE
CERTIFICATE OF CORRECTION

| | |
|---|---|
| PATENT NO. | : 10,790,233 B2 |
| APPLICATION NO. | : 16/097597 |
| DATED | : September 29, 2020 |
| INVENTOR(S) | : Robert Alan May et al. |

It is certified that error appears in the above-identified patent and that said Letters Patent is hereby corrected as shown below:

In the Specification

Column 1, Line 3 (approx.), Below Title, insert:
-- CROSS-REFERENCE TO RELATED APPLICATION
This application is a national stage application under 35 U.S.C. § 371 of PCT International Application Serial. No. PCT/US2016/034016, filed on May 25, 2016, and entitled "PACKAGE SUBSTRATE WITH INTEGRAL DEVICES," which is hereby incorporated by reference herein in its entirety. --.

Signed and Sealed this
Seventeenth Day of November, 2020

Andrei Iancu
*Director of the United States Patent and Trademark Office*